United States Patent
Chou et al.

(10) Patent No.: US 12,283,526 B2
(45) Date of Patent: Apr. 22, 2025

(54) EDGE FIN TRIM PROCESS

(71) Applicant: Taiwan Semiconductor Manufacturing Company, Ltd., Hsinchu (TW)

(72) Inventors: Jen-Chun Chou, Hsinchu (TW); Ren-Yu Chang, Hsinchu (TW); Che-Cheng Chang, New Taipei (TW); Chen-Hsiang Lu, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 409 days.

(21) Appl. No.: 17/521,610

(22) Filed: Nov. 8, 2021

(65) Prior Publication Data
US 2022/0301937 A1 Sep. 22, 2022

Related U.S. Application Data

(60) Provisional application No. 63/161,784, filed on Mar. 16, 2021.

(51) Int. Cl.
*H01L 21/8234* (2006.01)
*H01L 21/3065* (2006.01)
(Continued)

(52) U.S. Cl.
CPC .. *H01L 21/823431* (2013.01); *H01L 21/3065* (2013.01); *H01L 21/3085* (2013.01);
(Continued)

(58) Field of Classification Search
CPC ......... H01L 21/823431; H01L 21/3065; H01L 21/3085; H01L 21/3086; H01L 21/823481; H01L 29/6681
See application file for complete search history.

(56) References Cited

U.S. PATENT DOCUMENTS

2016/0056045 A1* 2/2016 Huang ................ H01L 21/3065
438/694
2016/0351565 A1 12/2016 Sung
(Continued)

FOREIGN PATENT DOCUMENTS

KR  20150060525 A  6/2015

OTHER PUBLICATIONS

Sung-Hsin Yang, et al., High Voltage Device, U.S. Appl. No. 17/008,251, filed Aug. 31, 2020, Assignee: Taiwan Semiconductor Manufacturing Co., Ltd., Specification 25 pages, Drawings 11 pages.

*Primary Examiner* — Christine A Enad
(74) *Attorney, Agent, or Firm* — HAYNES AND BOONE, LLP

(57) ABSTRACT

Semiconductor structures and methods are provided. In one embodiment, a method of the present disclosure includes forming a plurality of semiconductor fins over a substrate, after the forming of the plurality of semiconductor fins, removing an outer semiconductor fin of the plurality of semiconductor fins, and forming a gate structure over the plurality of semiconductor fins. The plurality of semiconductor fins include more than 3 semiconductor fins and the removing recesses a portion of the substrate directly under the outer semiconductor fin.

20 Claims, 41 Drawing Sheets

(51) Int. Cl.
*H01L 21/308* (2006.01)
*H01L 29/66* (2006.01)

(52) U.S. Cl.
CPC .. *H01L 21/3086* (2013.01); *H01L 21/823481* (2013.01); *H01L 29/6681* (2013.01)

(56) References Cited

U.S. PATENT DOCUMENTS

| | | | |
|---|---|---|---|
| 2016/0351663 A1 | 12/2016 | Park | |
| 2017/0316982 A1* | 11/2017 | Chang | H01L 21/823821 |
| 2017/0338225 A1* | 11/2017 | Ching | H01L 21/3085 |
| 2018/0012969 A1* | 1/2018 | Cheng | H01L 21/823431 |
| 2019/0287966 A1 | 9/2019 | Guler | |
| 2020/0119010 A1* | 4/2020 | Lee | H01L 21/823481 |
| 2020/0273754 A1 | 8/2020 | Liang | |
| 2021/0066119 A1 | 3/2021 | Lin | |
| 2021/0257250 A1* | 8/2021 | Kim | H01L 27/0886 |

* cited by examiner

EDGE FIN TRIM PROCESS

PRIORITY DATA

This application claims priority to U.S. Provisional Patent Application No. 63/161,784, filed on Mar. 16, 2021, entitled "Edge Fin Trim Process," the entirety of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate).

In some existing technologies, formation of FinFETs involves forming multiple semiconductor fins that extend parallel to one another. Such multiple semiconductor fins may come in groups. Each group may include a center portion and an edge portion. Because the semiconductor fins in the edge portion are in a more loosely packed region, they may be wider than semiconductor fins in the center portion. Therefore, while fin formation processes generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
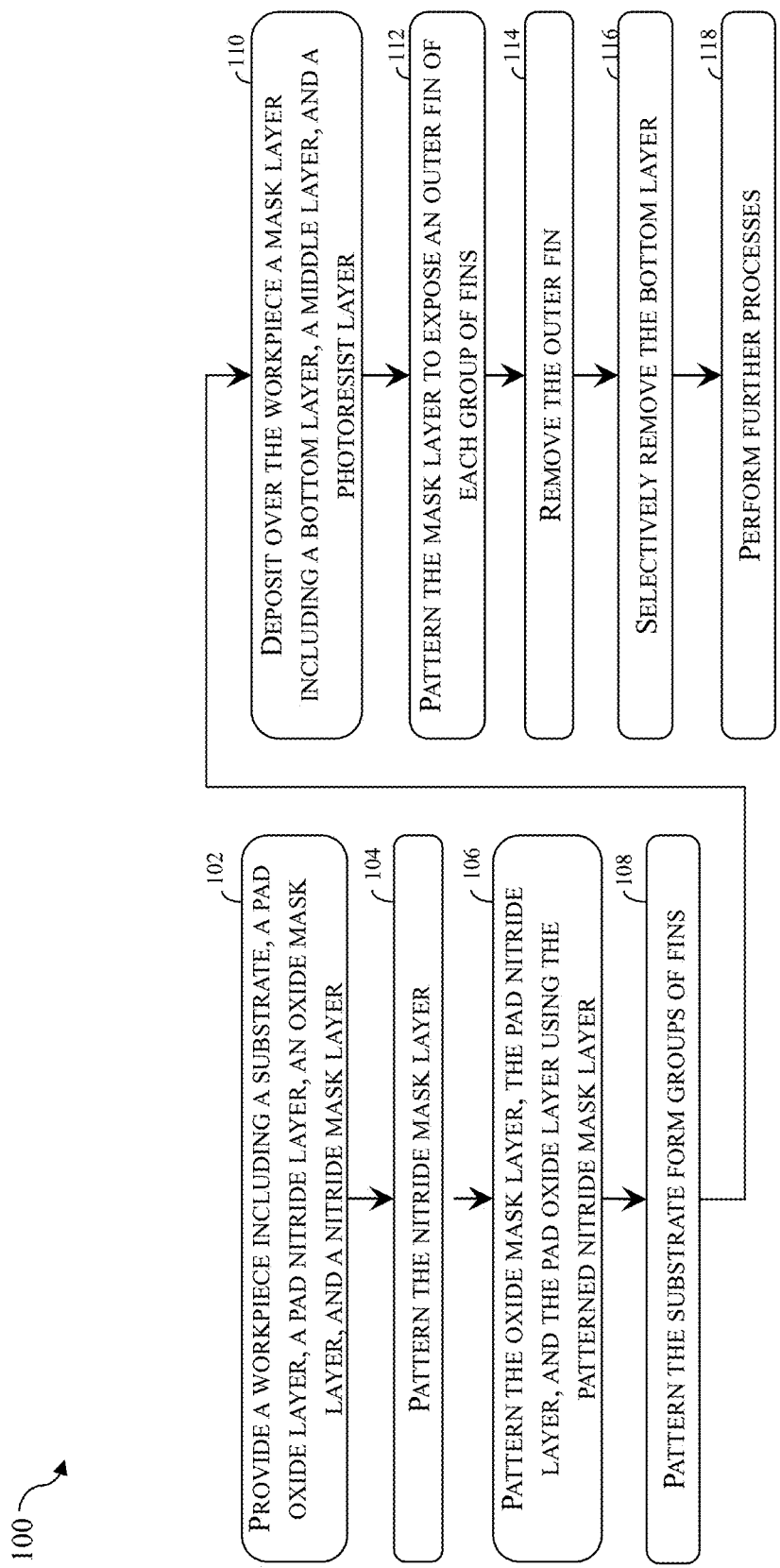
FIG. 1 illustrates a flow chart of a method for forming a semiconductor structure having a plurality of semiconductor fins, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Still further, example embodiments are described herein with reference to various fragmentary cross-sectional or top-view illustrations that are schematic and/or idealized. As such, variations from the shapes of the illustration as a result of fabrication tolerances are to be expected. Unless explicitly specified herein, shapes in the illustrations may not be intended to illustrate the actual shapes and should not limit the scope of the present disclosure. Additionally, unless otherwise defined, all terms used herein have the same meanings as commonly understood by one of ordinary sill in the art to which the example embodiments belong.

An IC device may include various kinds of transistors serving different functions such as logic functions, memory functions, input/output functions, or electrostatic discharge (ESD) functions. To meet on-state current, leakage or resistance requirements called for by different functions, these transistors may have different active region arrangements. Some design requires multi-fin transistors having three or more semiconductor fins to increase on-state current while maintaining gate control. To form such multi-fin transistors, fins that are parallel to one another may be formed in groups. It is observed that when the number of fins in a group is three or more, etch loading effect may cause the fins in the middle to be thinner than fins on the edge. This is so because the fins in the middle are located in a more densely packed region while the fins on the edge are located in a more isolated or loosely packed region. The same effect is not observed in a double-fin device because both fins in the double fin device are subject to the same etch loading conditions. Because fins of different widths may exhibit different on-state currents and different gate control, uneven widths of fins may result in variations in device performance and process control.

The present disclosure provides methods to reduce or eliminate unevenness of fin widths in multi-fin devices after the fins are formed. In one embodiment, after the semiconductor fins are formed, the outer fin that has a greater width is selectively removed. In another embodiment, the outer fin is selectively trimmed while the rest of the fins are protected by a mask. The semiconductor fins may include silicon, silicon germanium, or germanium. Methods of the present disclosure may even out widths of the fins in a group and improve device performance by 0.5% or more.

Figure 14:
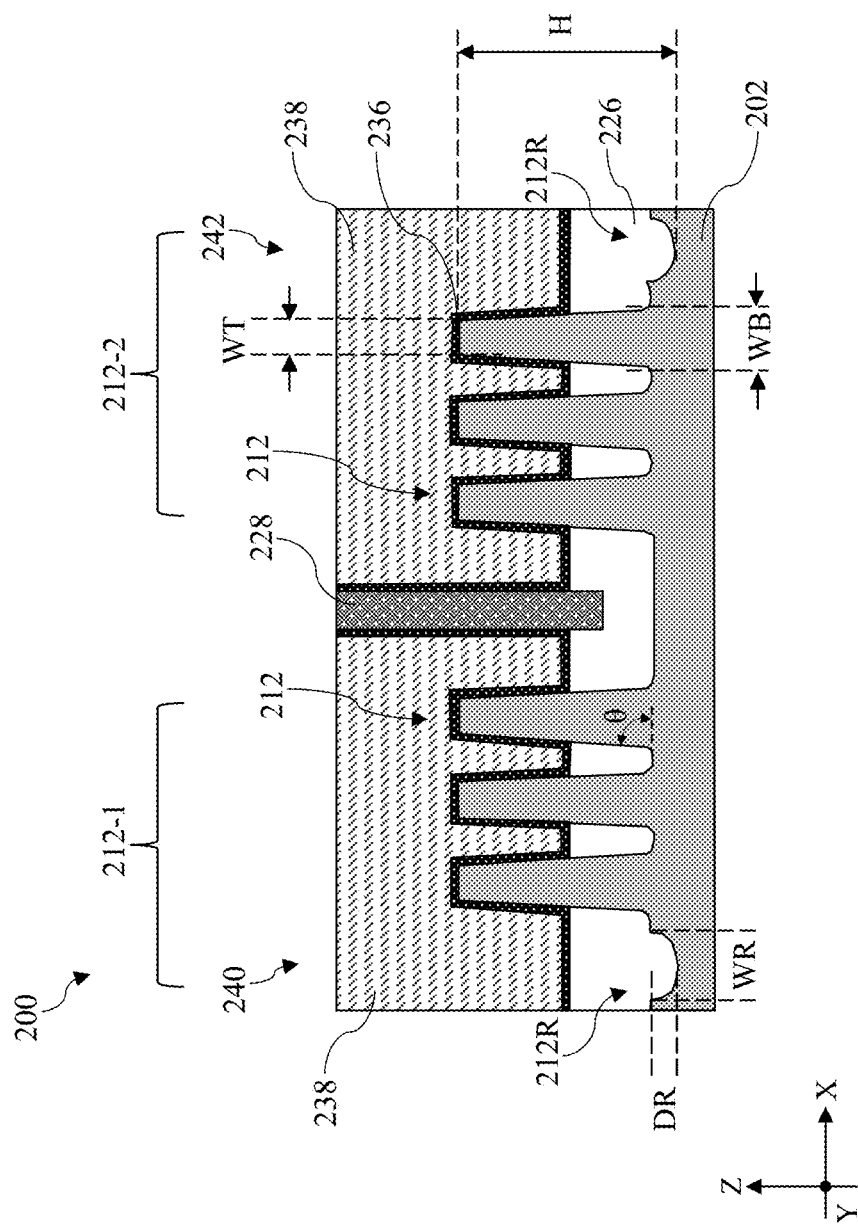
Figure 15:
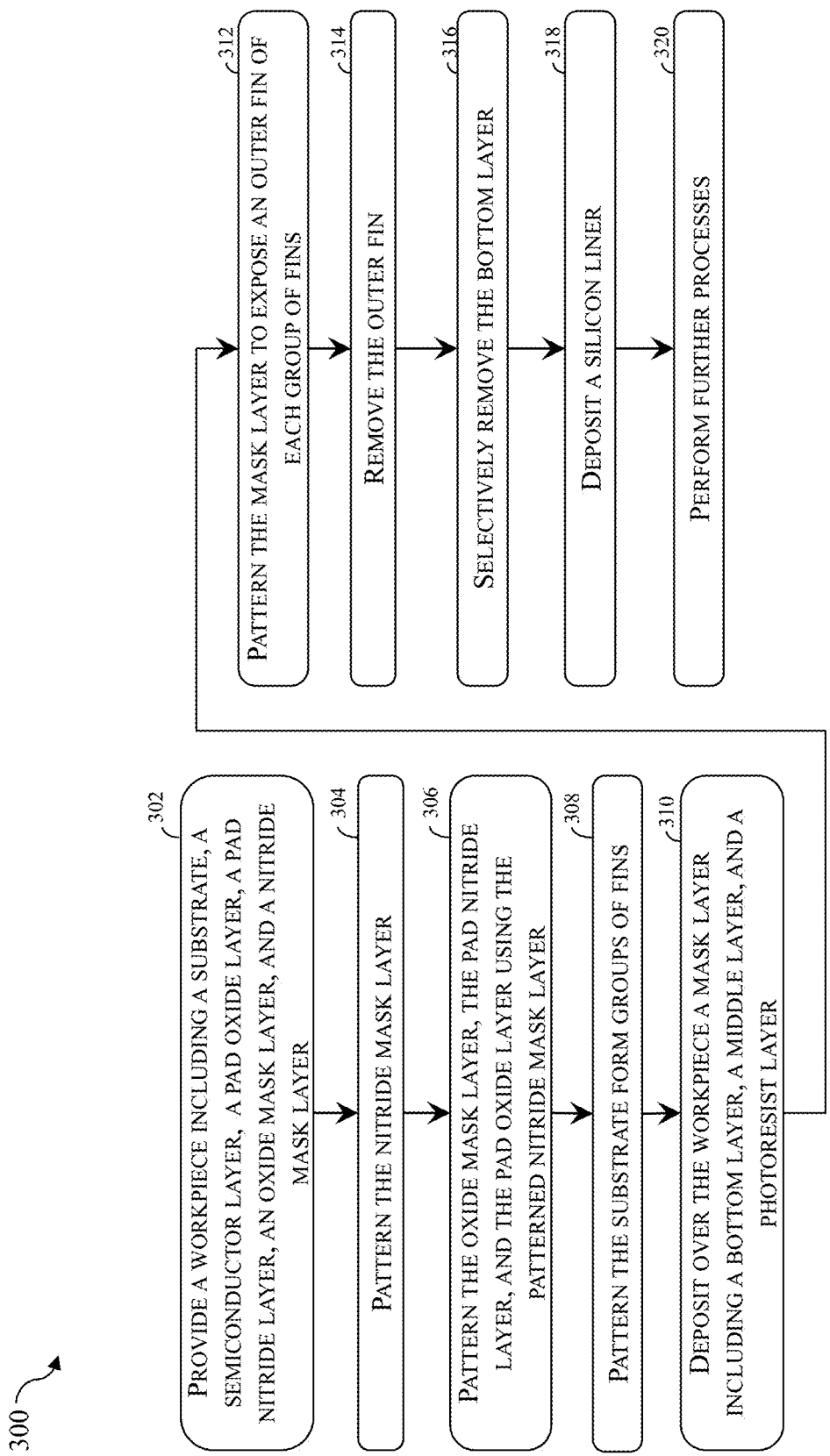
FIG. 15 illustrates a flow chart of a method for forming a semiconductor structure having a plurality of semiconductor fins, according to one or more aspects of the present disclosure.

The various aspects of the present disclosure will now be described in more detail with reference to the figures. In that regard, FIGS. 1, 15 and 28 are flowcharts illustrating methods 100, 300 and 400 of forming a semiconductor device according to embodiments of the present disclosure. Methods 100, 300 and 400 are merely examples and are not intended to limit the present disclosure to what is explicitly illustrated in methods 100, 300 and 400. Additional steps may be provided before, during and after method 100, 300 or 400, and some steps described can be replaced, eliminated, or moved around for additional embodiments of the method. Not all steps are described herein in detail for reasons of simplicity. Methods 100, 300 and 400 are described below in conjunction with FIGS. 2-14, 16-27 and 29-41, which are fragmentary cross-sectional views or top views of a workpiece 200 at different stages of fabrication according to methods 100, 300 and 400. Because the workpiece 200 will be fabricated into a semiconductor device or a semiconductor structure upon conclusion of the fabrication processes, the workpiece 200 may also be referred to as the semiconductor device 200 or a semiconductor structure 200 as the context requires. Additionally, throughout the present application, like reference numerals denote like features, unless otherwise excepted. Furthermore, while semiconductor devices illustrated in the figures may have three fins, the present disclosure is not so limited and may be applicable to semiconductor device having three or more fins in one transistor.

Figure 2:
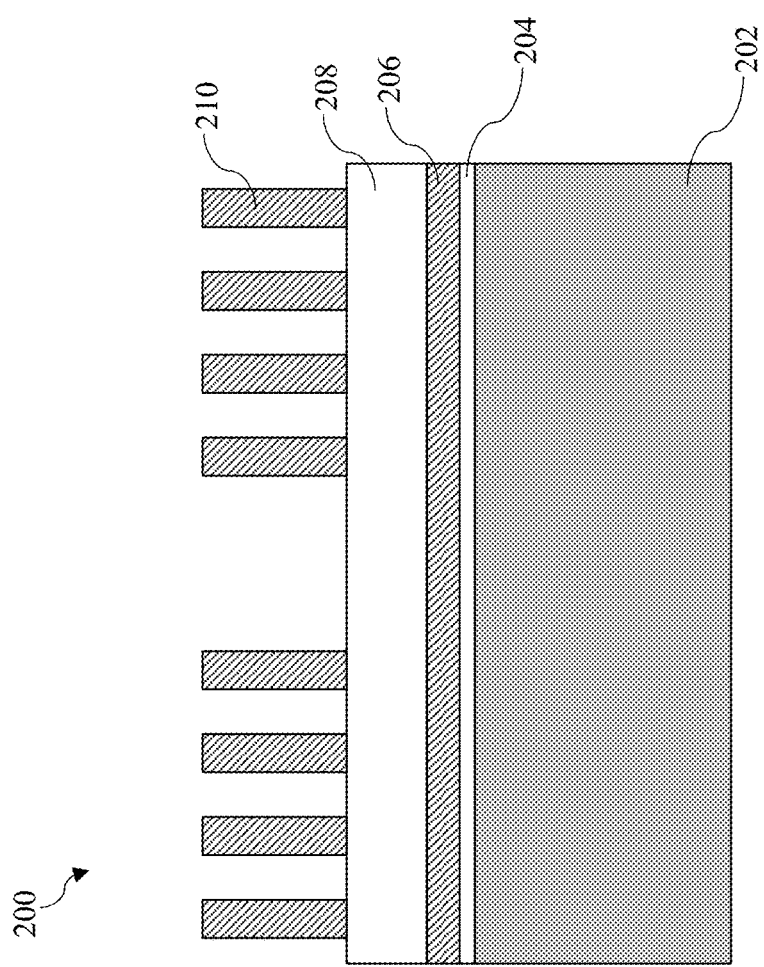
FIGS. 2-14 illustrate fragmentary cross-sectional views or top views of a workpiece during a fabrication process according to the method of FIG. 1, according to one or more aspects of the present disclosure.

Referring to FIGS. 1 and 2, method 100 includes a block 102 where a workpiece 200 is provided. As shown in FIG. 2, the workpiece 200 includes a substrate 202, a pad oxide layer 204, a pad nitride layer 206, an oxide mask layer 208, and a nitride mask layer 210. The substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. As shown in FIG. 2, the workpiece 200 further includes a pad oxide layer 204 disposed on the substrate 202, a pad nitride layer 206 disposed on the pad oxide layer 204, an oxide mask layer 208 disposed on the pad nitride layer 206, and a nitride mask layer 210 disposed on the oxide mask layer 208. In some embodiments, the pad nitride layer 206 is thicker than the pad oxide layer 204 and the nitride mask layer 210 is thicker than the oxide mask layer 208. In some instances, the pad oxide layer 204 may include silicon oxide and may have a thickness between about 15 Å and about 35 Å; the pad nitride layer 206 may include silicon nitride and may have a thickness between about 200 Å and about 300 Å; the oxide mask layer 208 may include silicon oxide and may have a thickness between about 300 Å and about 700 Å; and the nitride mask layer 210 may include silicon nitride and may have a thickness between about 400 Å and about 1000 Å. The pad oxide layer 204, the pad nitride layer 206, the oxide mask layer 208, and the nitride mask layer 210 may be deposited using chemical vapor deposition (CVD), plasma-enhanced CVD (PECVD), or low-pressure CVD (LPCVD).

Referring to FIGS. 1 and 2, method 100 includes a block 104 where the nitride mask layer 210 is patterned. At block 104, the nitride mask layer 210 may be patterned using photolithography and etch processes. In an example process, a photoresist layer (not explicitly shown) is deposited over the nitride mask layer 210. The photoresist layer is exposed to a patterned radiation reflected from or transmitting through a photomask, developed in a developer solution, and baked in a bake process, so as to form a patterned photoresist layer. The patterned photoresist layer may then be used as an etch mask when the nitride mask layer 210 is etched in a dry etch process, thereby forming the patterned nitride mask layer 210 shown in FIG. 2. An example dry etch process may be a reactive-ion-etching (RIE) process that uses nitrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 3:
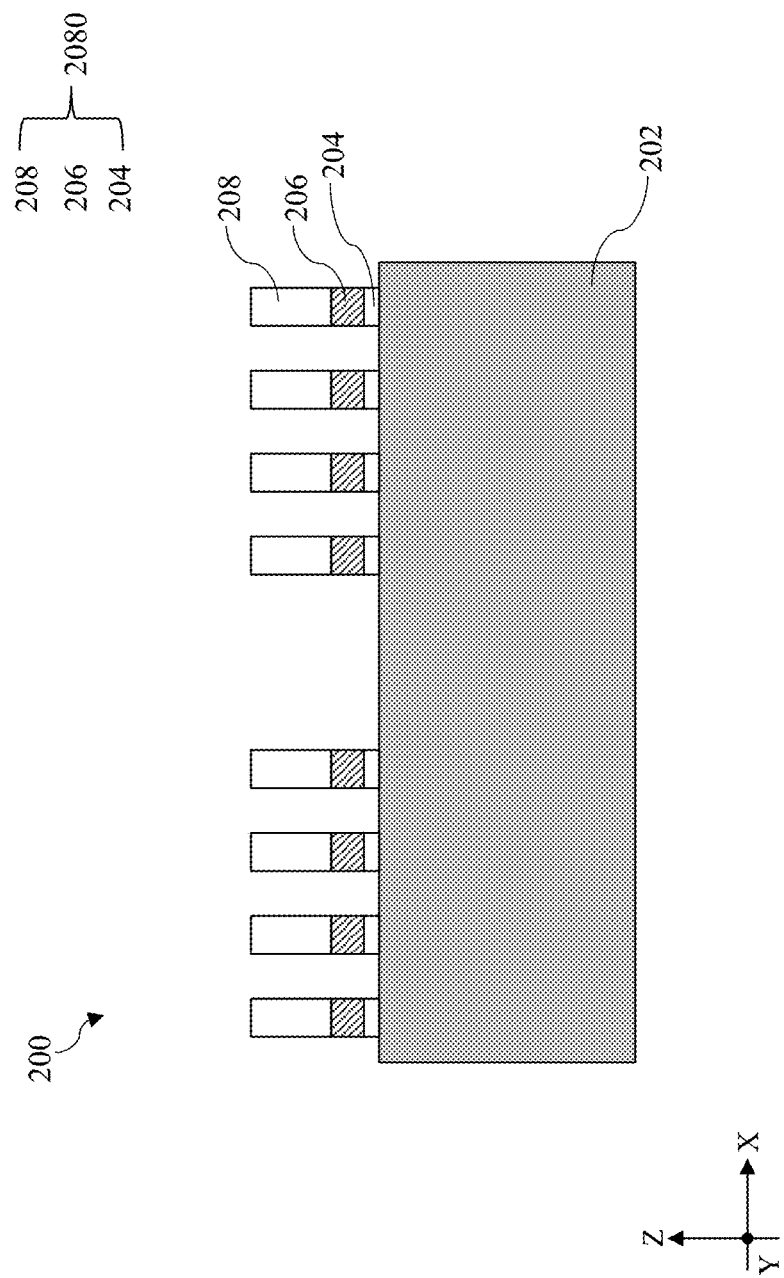

Referring to FIGS. 1 and 3, method 100 includes a block 106 where the oxide mask layer 208, the pad nitride layer 206, and the pad oxide layer 204 are patterned using the patterned nitride mask layer 210 as an etch mask. In some embodiments, the etch process at block 106 may be a reactive-ion-etching (RIE) process that uses oxygen, hydrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Upon conclusion of the operations at block 106, a patterned oxide mask layer 2080 is formed. The patterned oxide mask layer 2080 includes the pad oxide layer 204, the pad nitride layer 206, and the oxide mask layer 208. In some instances, patterns in the patterned oxide mask layer 2080 may have uneven widths. To prevent uneven pattern widths from causing uneven fin widths, additional photolithography and etch processes may be optionally performed to selectively trim the wider patterns.

Figure 4:
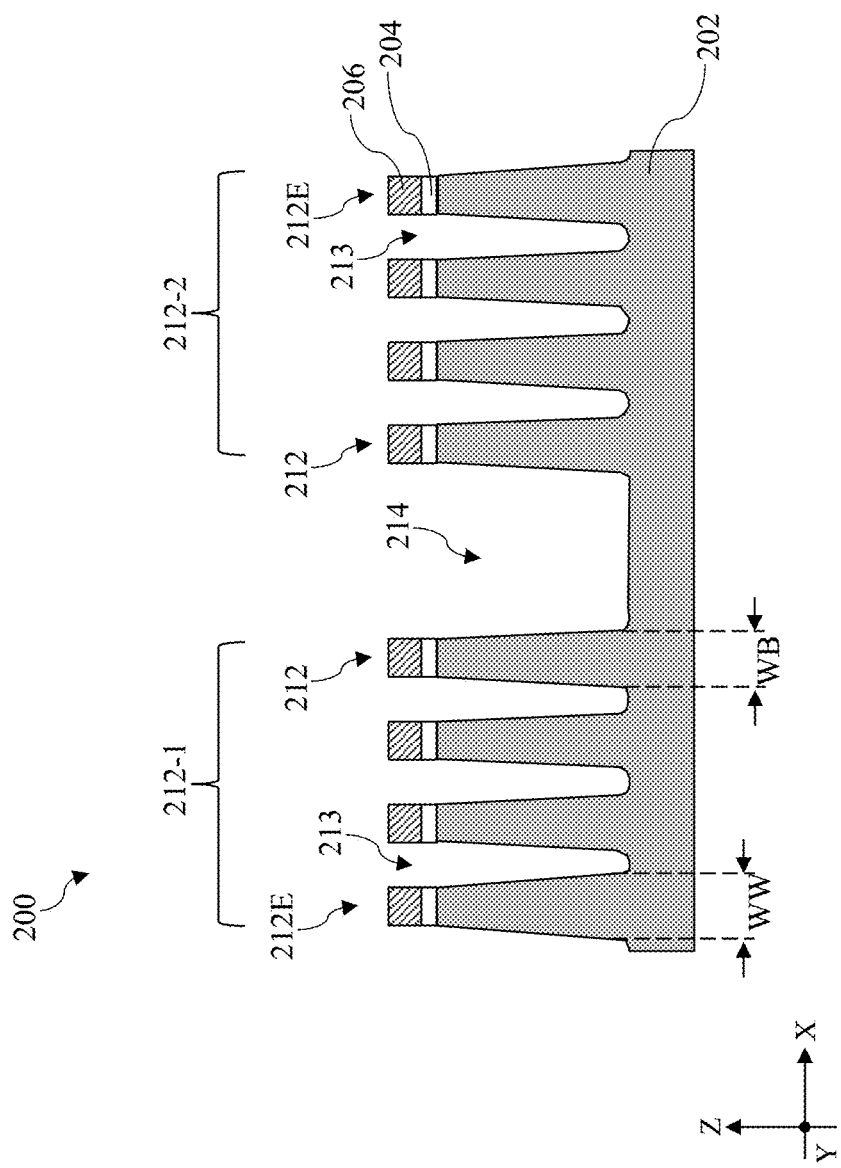

Referring to FIGS. 1 and 4, method 100 includes a block 108 where the substrate 202 is patterned to form groups of fins 212. At block 108, the substrate 202 is anisotropically etched using the patterned oxide mask layer 2080 as an etch mask. In some embodiments, the anisotropic etch may be performed using an RIE process that uses hydrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 4, the anisotropic etching may form groups of fins 212, such as a first group of fins 212-1 and a second group of fins 212-2. The first group of fins 212-1 is spaced apart from the second group of fins 212-2 by an opening 214. The first group of fins 212-1 includes fins 212 and an edge fin 212E, which are interleaved by trenches 213. The edge fin 212E may also be referred to as an outer fin 212E. Similarly, the second group of fins 212-2 includes fins 212 and an edge fin 212E, which are interleaved by trenches 213. In the depicted embodiment, the fins (of the first group of fins 212-1 and the second group of fins 212-2) that are adjacent the opening 214 are not considered edge fins, especially when a width of the opening 214 is smaller than about 55 nm. Due to its small width, the opening 214 does not cause substantial loading effect that requires correction. As shown in FIG. 4, a portion of the pad oxide layer 204 and a portion of the pad nitride layer 206 may remain disposed over the fins 212 or edge fins 212E. In the depicted embodiments, the oxide mask layer 208 may be substantially removed during the etching of the substrate 202. In the embodiments represented in FIG. 4, the fins 212 and the edge fins 212E may have tapered sidewalls and may have similar height. The height of the fins 212 and the edge fins 212E may be between about 50 nm and about 150 nm, exclusive of the thicknesses of the pad oxide layer 204 and the pad nitride layer 206. Additionally, due to etch loading effect, each of the edge fins 212E may be greater in width than each of the fins 212. For example, each of the edge fins 212E may have bottom fin width WW and each of the fins 212 may have a bottom fin width WB. The bottom fin width WW of each of the edge fin 212E may be greater than the bottom fin width WB of each of the fins 212. In some instances, the bottom fin width WW may be between about 12 nm and about 25 nm and the bottom fin width WB may be between about 10 nm and about 20 nm.

Figure 5:
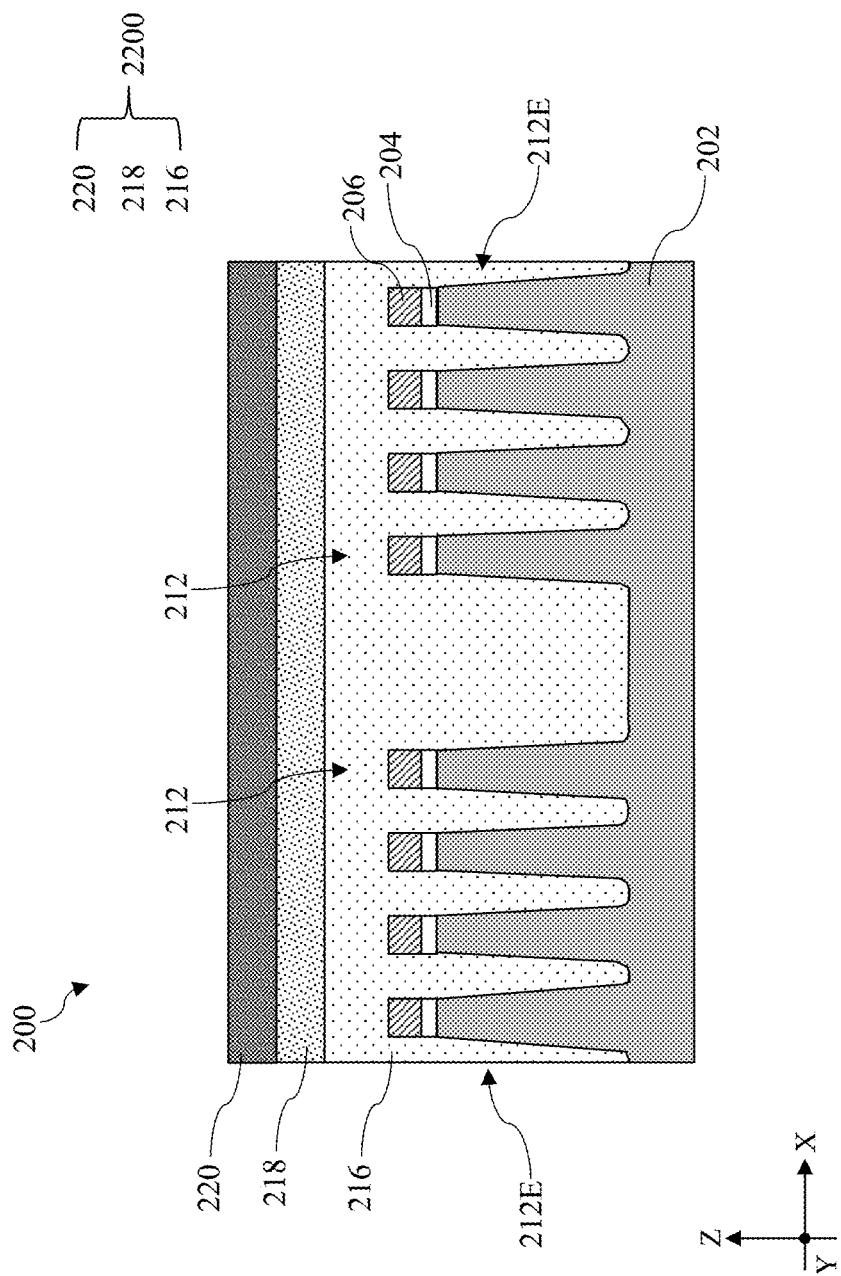

Referring to FIGS. 1 and 5, method 100 includes a block 110 where a mask layer 2200 is deposited over the workpiece 200. In the depicted embodiment, the mask layer 2200 is a multi-layer and includes a bottom layer 216, a middle layer 218, and a photoresist layer 220. A curing process, such as an anneal process, may be performed after the deposition of the bottom layer 216. Upon formation, the bottom layer 216 is a carbon-containing layer and may include silicon carbide (SiC), silicon oxycarbide (SiOC), or spin-on carbon (SOC). The middle layer 218 is a silicon-containing layer that includes silicon, nitrogen, and hydrogen. In one embodiment, the middle layer 218 is a bottom antireflective coating (BARC) layer and includes polysilazane resin. The bottom layer 216 may be regarded as a carbon hard mask layer and the middle layer 218 may be regarded as a silicon hard mask layer. The bottom layer 216, the middle layer 218, and the photoresist layer 220 may be deposited using flowable CVD (FCVD) or spin-on coating. A curing process, such as an anneal process or a baking process, may be performed after the deposition of the bottom layer 216, the middle layer 218 and the photoresist layer 220. The mask layer 2200 may also be referred to as a trilayer. As shown in FIG. 5, the bottom layer 216 fills the trenches 213 and the opening 214 among the fins 212 and edge fins 212E.

Figure 6:
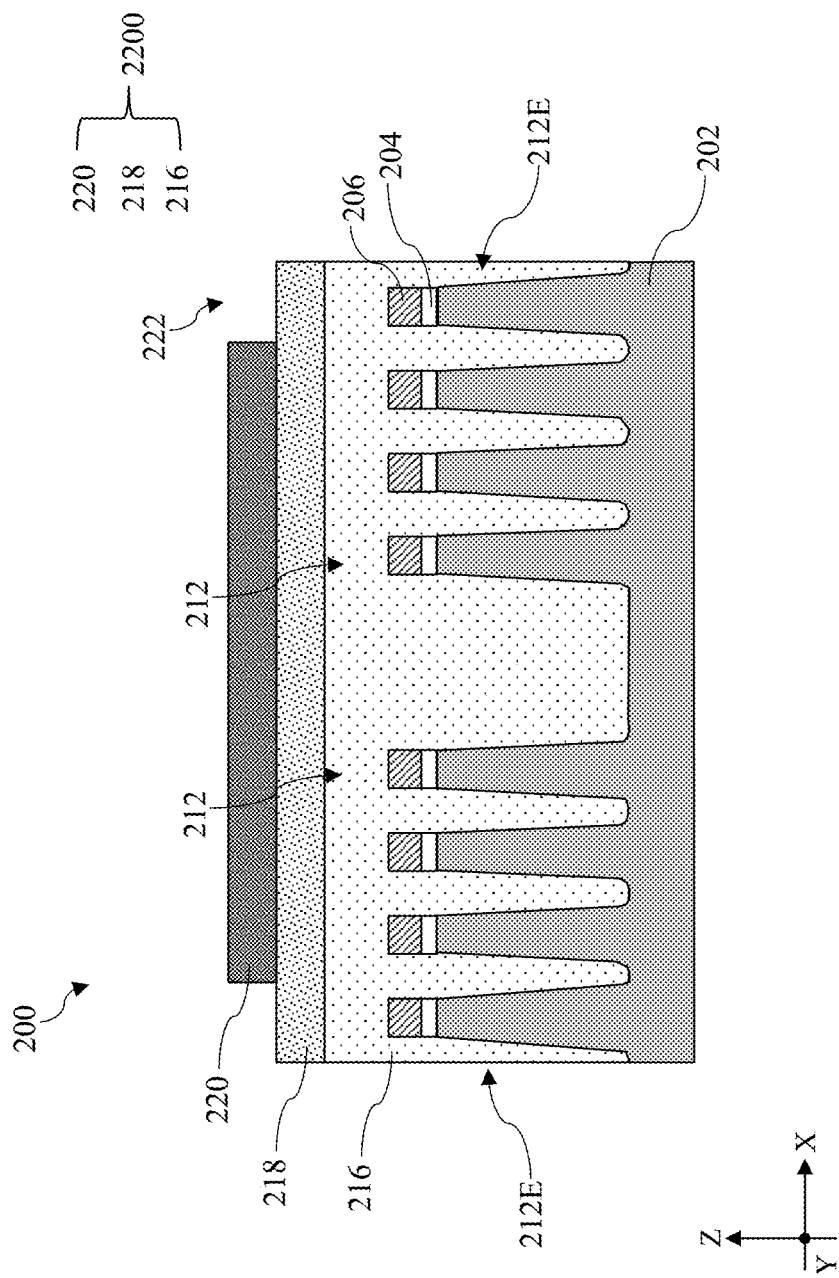
Figure 7:
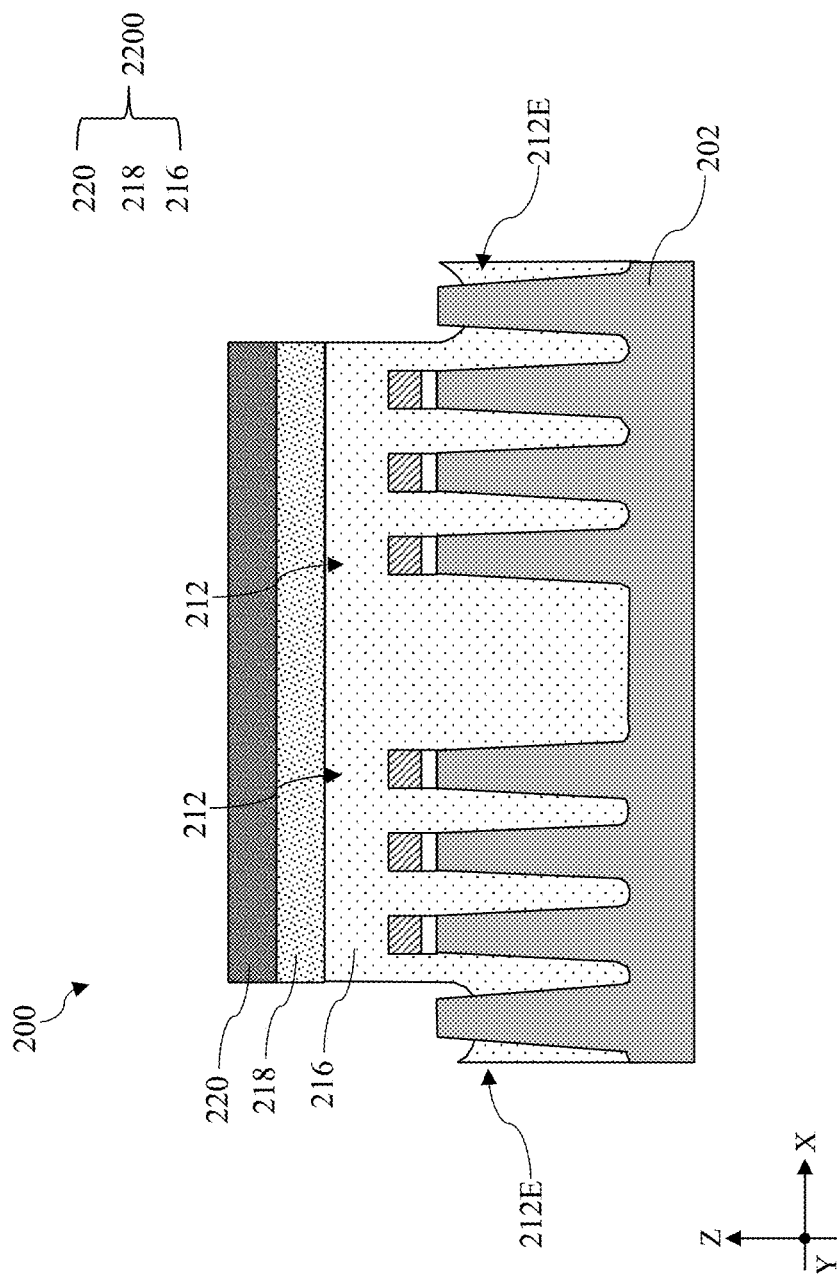

Referring to FIGS. 1, 6 and 7, method 100 includes a block 112 where the mask layer 2200 is patterned to expose the outer fins 212E. In an example process, the photoresist layer 220 is first patterned using a photolithography process to form a patterned photoresist layer 220 that includes openings 222 directly over the edge fins 212E. In some embodiments, the patterned photoresist layer 220 may be treated with hydrogen bromide (HBr) plasma to improve line edge roughness (LER) and line width roughness (LWR). Thereafter, patterns of the patterned photoresist layer 220 are transferred to the middle layer 218 using etch processes that use gases that contain fluorine and carbon. In one embodiment, the middle layer 218 is etched in a dry etch process that uses difluoromethane ($CH_2F_2$). Then the patterns of the middle layer 218 are transferred to the carbon-rich bottom layer 216, as shown in FIG. 7. In one embodiment, the bottom layer 216 is etched in a dry etch process that includes use of oxygen ($O_2$) and sulfur dioxide ($SO_2$). In some embodiments represented in FIG. 7, to ensure protection of fins 212 other than the edge fins 212E, the bottom layer 216 is not etched through its entire thickness. As shown in FIG. 7, a portion of the bottom layer 216 over the edge fins 212E is etched or pulled backed to expose a portion or a top portion of the edge fins 212E. After the patterning of the bottom layer 216, a patterned mask layer 2200 is formed.

Figure 8:
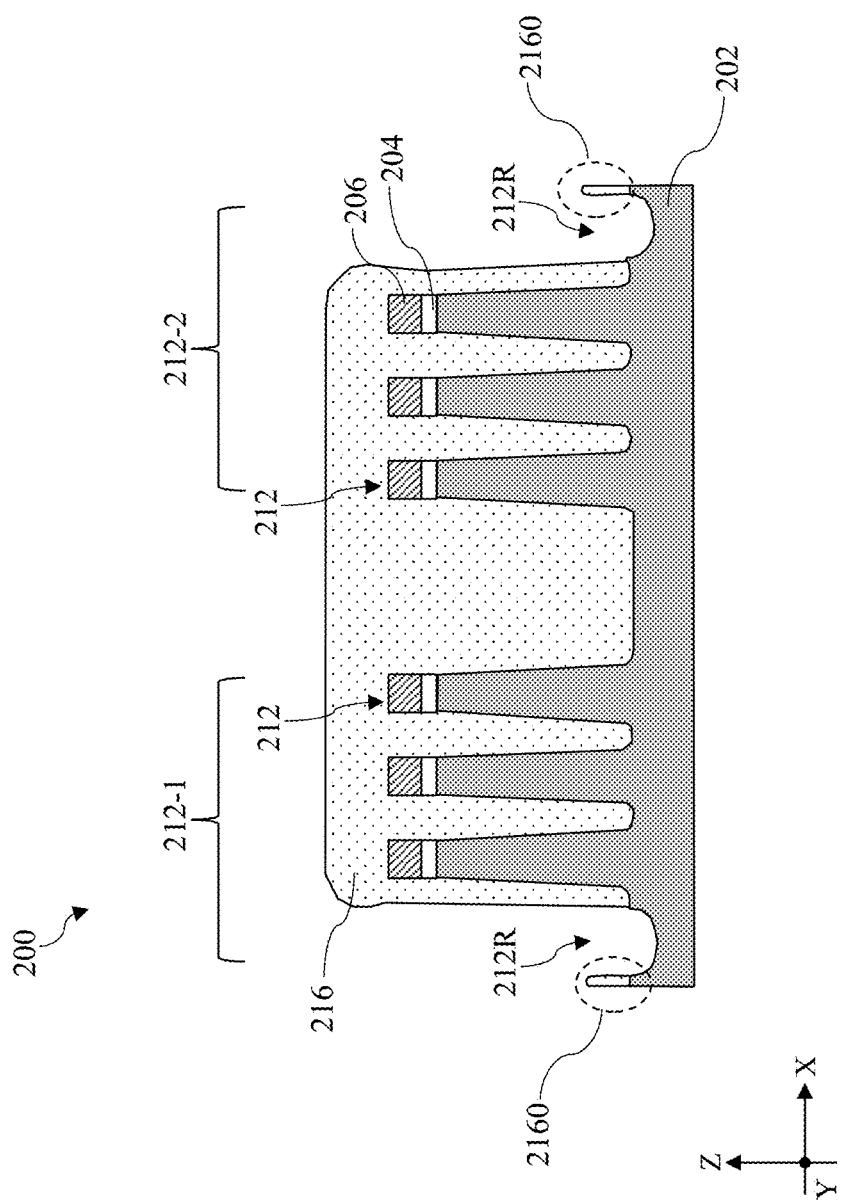

Referring to FIGS. 1 and 8, method 100 includes a block 114 where the outer fins 212E are removed. At block 114, the patterned mask layer 2200 is applied as an etch mask in removing the outer fins 212E (shown in FIG. 7) in the first group of fins 212-1 and the second group of fins 212-2. In some embodiments, the outer fins 212E are removed by a dry etch process that includes oxygen, hydrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In one embodiment, the dry etch process at block 114 may include use of sulfur hexafluoride ($SF_6$), difluoromethane ($CH_2F_2$), fluoromethane ($CH_3F$), and oxygen ($O_2$). In this embodiment, a flow rate ratio of sulfur hexafluoride ($SF_6$) to difluoromethane ($CH_2F_2$) is between about 3 and about 4, a flow rate of fluoromethane ($CH_3F$) is between about 10 standard cubic centimeters per minute (SCCM) and about 30 SCCM, and a flow rate ratio of difluoromethane ($CH_2F_2$) to oxygen ($O_2$) is between about 1 and about 2. To prevent shorts or leakage due to presence of residual edge fins 212E, the dry etch at block 114 is performed until edge recesses 212R are formed under the removed edge fins 212E. The edge recesses 212R vertically extend into the substrate 202. According to the present disclosure, the dry etch process at block 114 is selected such that it selectively etches the edge fins 212E relative to the bottom layer 216, which is a carbon hard mask. As illustrated in FIG. 8, the selective etching of the edge fins 212E does not substantially etch the bottom layer 216 and some residual bottom layer features 216O may remain disposed over the substrate 202 adjacent the edge recesses 212R.

Figure 9:
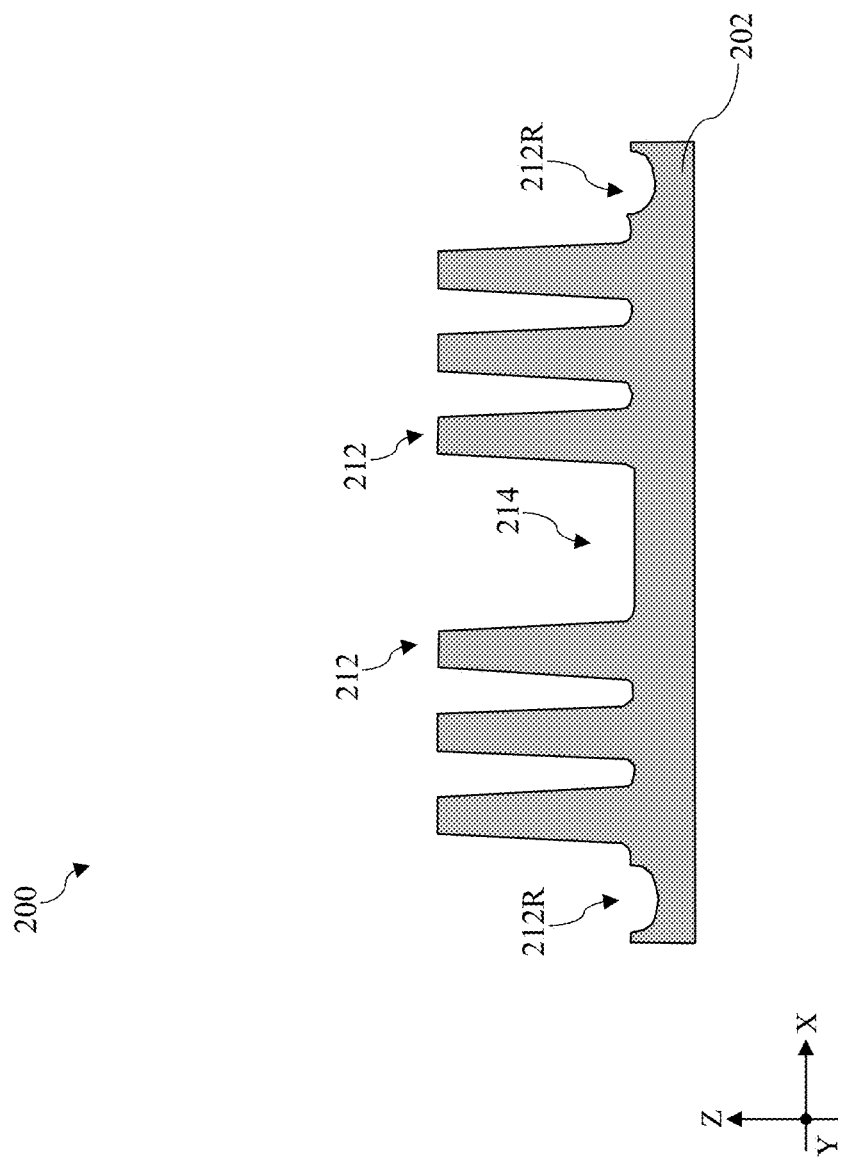

Referring to FIGS. 1 and 9, method 100 includes a block 116 where the bottom layer 216 is selectively removed. In some embodiments, the remaining bottom layer 216 and bottom layer features 216O may be selectively removed using a dry etch process that implements oxygen ($O_2$) and sulfur dioxide ($SO_2$). Because the dry etch process at block 116 is selective to the bottom layer 216, the substrate 202 and the fins 212 are not substantially etched at block 116. In some embodiments represented in FIG. 9, the pad oxide layer 204 and the pad nitride layer 206 over the fins 212 may also be removed using one or more etch processes. In some alternative embodiments, the pad oxide layer 204 and the pad nitride layer 206 may be removed after the formation of the isolation feature (described below).

Referring to FIGS. 1, 10, 11, 12, and 14, method 100 includes a block 118 where further processes are performed. Such further processes may include a fin coarse cut process (shown in FIG. 10), formation of an isolation feature 226 among the fins 212 (shown in FIG. 11), formation of a dielectric fin 228 over the isolation feature 226 (shown in FIG. 11), formation of a dummy gate stack 230 (shown in FIG. 12), formation of source/drain features (not explicitly shown), removal of the dummy gate stack 230 (shown in FIG. 13), and formation of gate structures (shown in FIG. 14).

Figure 10:
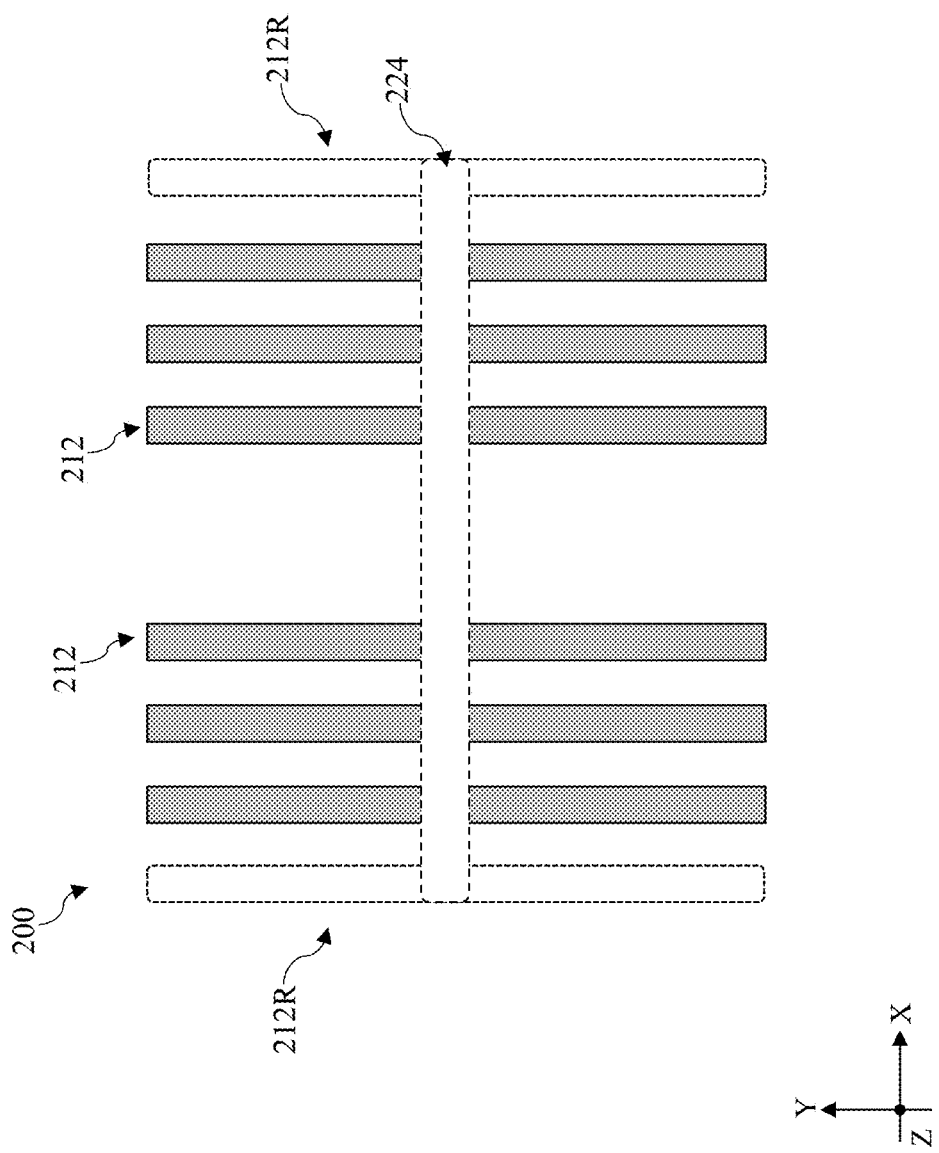

Reference is first made to FIG. 10, which illustrates a schematic top view of the workpiece 200. The removal of the edge fins 212E at block 114 is along lengthwise directions of the edge fins 212E and may be referred to as a fin fine cut process. As compared to a fin fine cut process, a fin coarse cut process refers to a process where the removed region extends across the lengthwise direction of the fins 212. An example fin coarse cut process includes deposition of a mask layer similar to the mask layer 2200 and patterning the mask layer to form a patterned mask layer with an opening that span over and across several fins 212. In some instances represented in FIG. 10, a cut or an opening 224 may also extend over a portion of the edge recesses 212R. The patterned mask layer is then applied as an etch mask to etch the fins 212. As a result, the cut 224 may extend along the X direction across several fins 212 that extends lengthwise along the Y direction. It is noted that the fin fine cut process at block 114 and the fin coarse cut process may, in theory, be performed at the same time, provided that the openings in the patterned mask layer includes optical assist features that help to prevent edge rounding at intersections of fin fine cuts and fin coarse cuts. When the fin fine cut process and the fin coarse cut process are performed simultaneously, both of them may be performed at block 114 of method 100.

Figure 11:
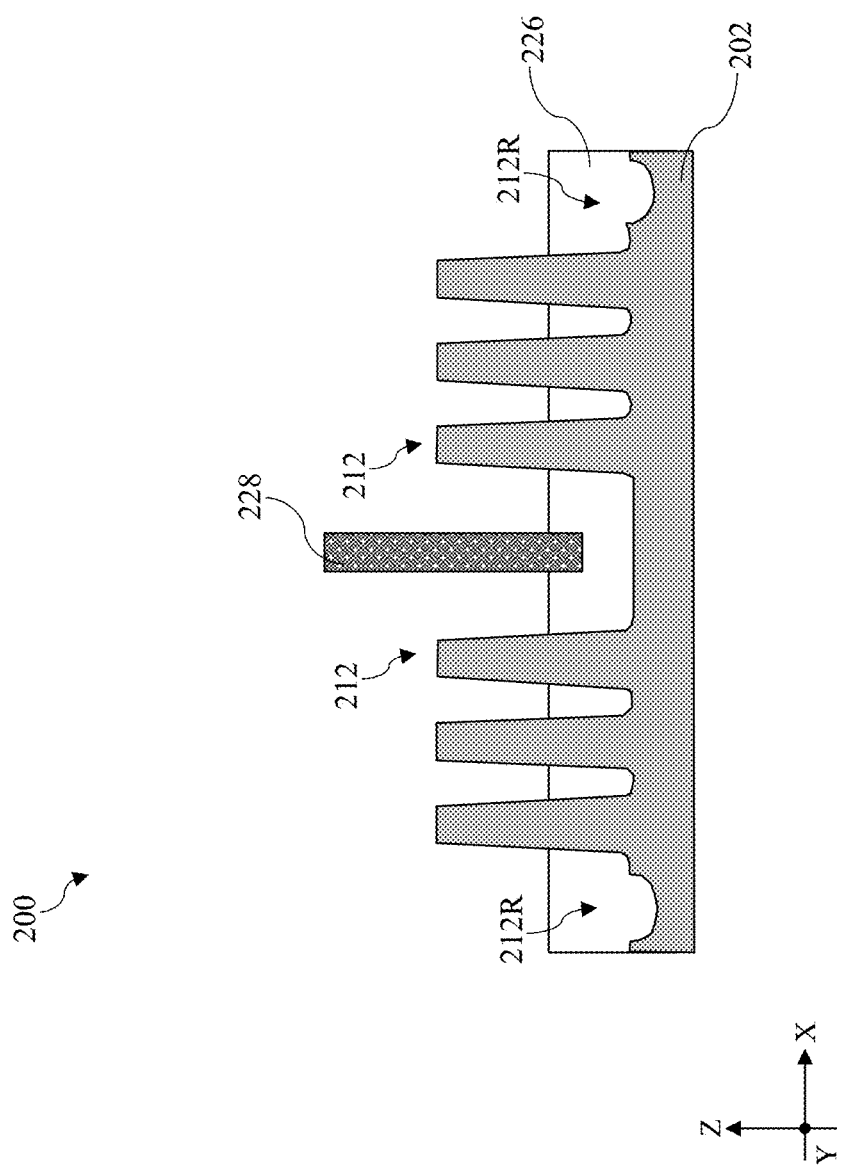

Referring to FIG. 11, the isolation feature 226 is formed over the substrate 202 to isolate the fins 212 from one another. The isolation feature 226 is also formed over and into the edge recesses 212R and the opening 214 (shown in FIG. 4). In the depicted embodiment, the isolation feature 226 surrounds bottom portions of fins 212. The isolation feature 226 may be referred to as a shallow trench isolation (STI) feature 226. In an example process, a dielectric layer is first deposited over the substrate 202, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, an FCVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the isolation feature 226.

Referring still to FIG. 11, the dielectric fin 228 may be formed over the isolation feature 226. In an example process, a first dielectric layer and a second dielectric layer may be sequentially and conformally deposited over the workpiece 200, including over the fins 212 and the isolation feature 226. A composition of the first dielectric layer may be similar to a composition of the isolation feature 226. The second dielectric layer may include a dielectric material different from the isolation feature 226. In some embodiments, the second dielectric layer may include silicon nitride, silicon carbonitride, silicon oxycarbonitride, aluminum oxide, zinc oxide, titanium oxide, zirconium oxide, hafnium oxide, or other suitable metal oxide. After the deposition of the first dielectric layer and the second dielectric layer, the first dielectric layer is selectively etched back until the second dielectric layer rises above the isolation feature 226 to form the dielectric fin 228. That is, the dielectric fin 228 and the second dielectric layer share the same composition.

Figure 12:
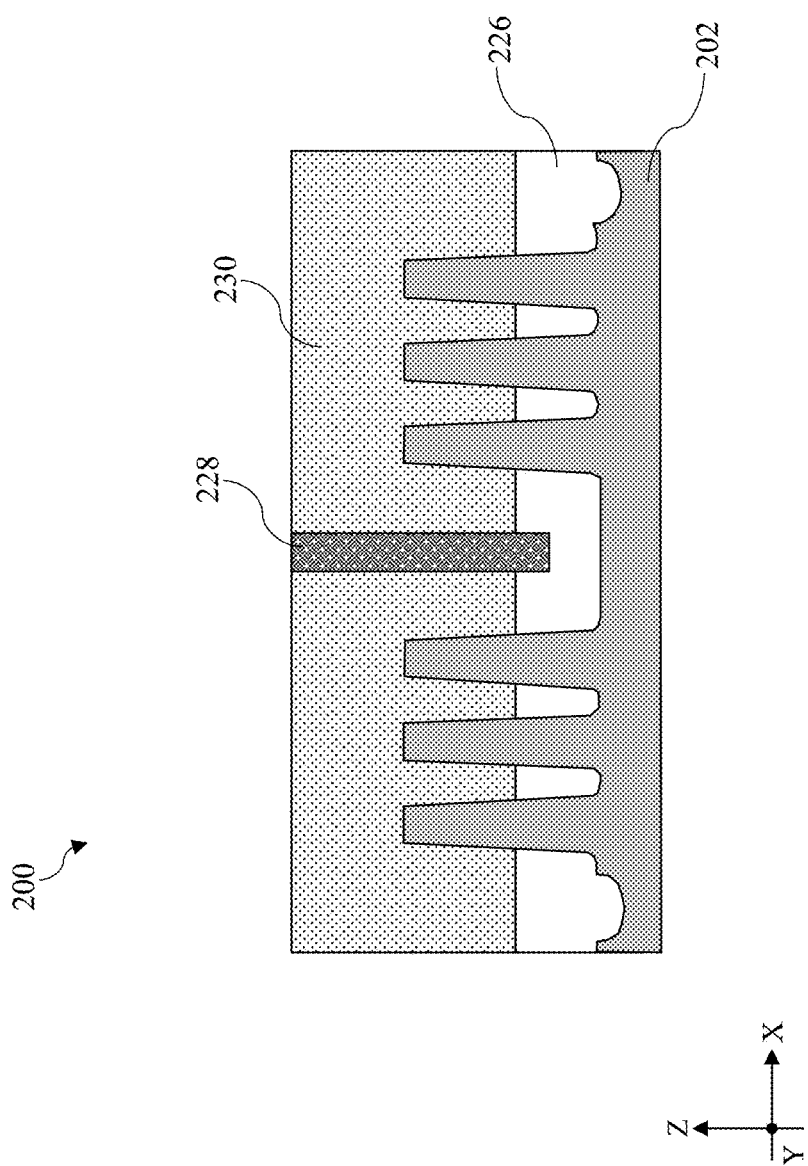

Referring to FIG. 12, the dummy gate stack 230 is deposited over the workpiece 200, including over the fins 212, the isolation feature 226, and the dielectric fin 228. In some embodiments, a gate replacement process (or gate-last process) is adopted where the dummy gate stack 230 serves as a placeholder to undergo various processes and is to be removed and replaced by the functional gate structure. While not explicitly shown, the dummy gate stack 230 may include a dummy gate dielectric layer and a dummy gate electrode over the dummy gate dielectric layer. In some instances, the dummy gate dielectric layer may include silicon oxide. The dummy electrode layer may include polysilicon. While not explicitly shown in the figures, one or more gate spacers may be deposited over sidewalls of the dummy gate stack 230 and source/drain regions of the fins 212 may be recessed. Epitaxial features may then be formed over the recessed source/drain regions. Epitaxial features may include silicon (Si) doped with an n-type dopant (e.g. phosphorus (P) or arsenic (As) or silicon germanium (SiGe) doped with a p-type dopant (e.g. boron (B) or boron difluoride ($BF_2$)). After the formation of epitaxial features, a contact etch stop layer (CESL) and an interlayer dielectric (ILD) layer may be sequentially deposited over the workpiece 200.

Figure 13:
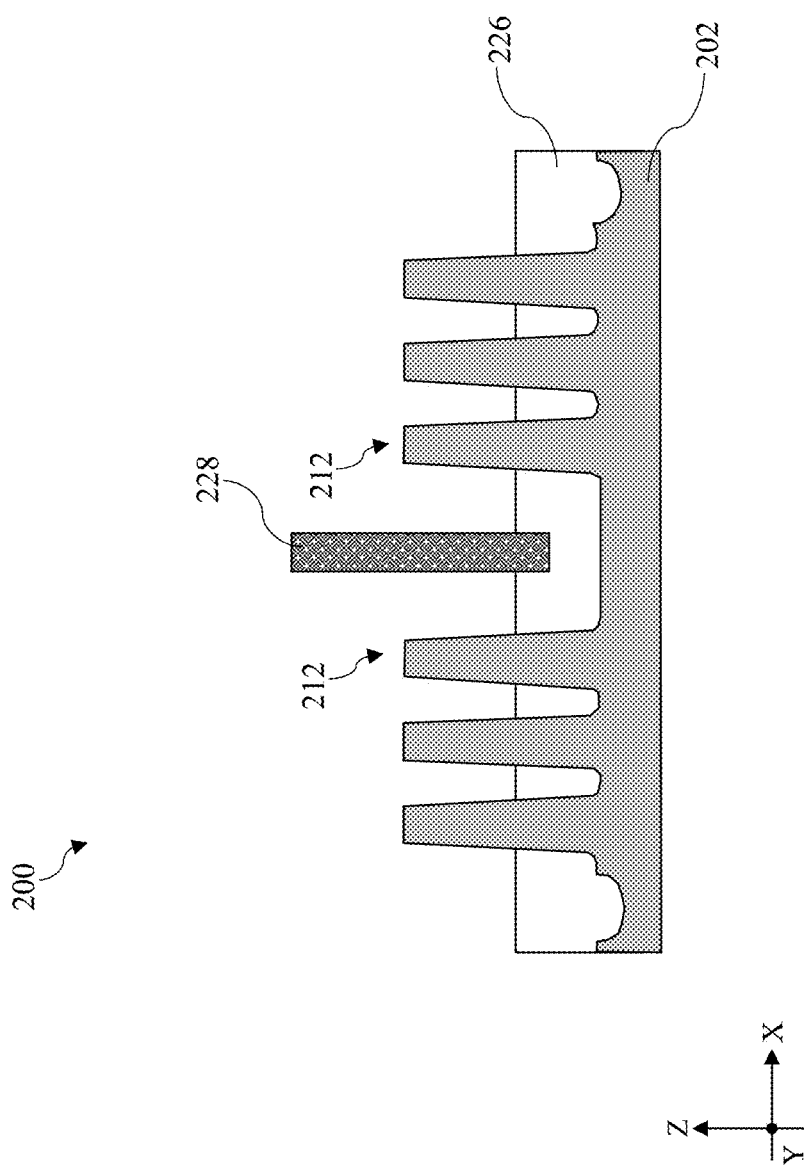

Referring to FIG. 13, after the formation of the ILD layer, the dummy gate stack 230 may be removed to expose the fins 212. Referring to FIG. 14, a first gate structure 240 is formed over fins 212 in the first group of fins 212-1 (minus the removed edge fin 212E) and a second gate structure 242 is formed over fins 212 in the second group of fins 212-2 (minus the removed edge fin 212E). The first gate structure 240 and the second gate structure 242 are separated in whole or in part by the dielectric fin 228. Each of the first gate structure 240 and the second gate structure 242 may include a gate dielectric layer 236 and a gate electrode layer 238. The gate dielectric layer 236 may include an interfacial layer and a high-k dielectric layer. The interfacial layer may include silicon oxide, hafnium silicate, or silicon oxynitride. The high-K dielectric layer may include hafnium oxide. Alternatively, the high-K dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. In some embodiments represented in FIG. 14, the first gate structure 240 is configured to control a transistor that includes three fins 212 in the first group of fins 212-1 and the second gate structure 242 is configured to control another transistor that includes three fins 212 in the second ground of fins 212-2. In the depicted embodiment, each of the first gate structure 240 and the second gate structure 242 extend over the edge recesses 212R, which are now filled with the isolation feature 226.

Reference is still made to FIG. 14. Because the wider edge fins 212E have been removed at block 114 of method 100, the fins 212 in the first group of fins 212-1 and the second group of fins 212-2 are substantially uniform in size, profile angles, and shapes. As shown in FIG. 14, each of the fins 212 may include a bottom width WB, a top width WT, and a profile angle θ. In some instances, the bottom width WB may be between about 10 nm and about 20 nm, the top width WT may be between about 8 nm and about 19 nm, and the profile angle θ may be between about 83° and about 90°. The edge recesses 212R are now filled by the isolation feature 226. Each of the edge recesses 212R has a width WR and a depth DR. In some instances, the width WR may be between about 15 nm and about 30 nm and the depth DR may be between about 5 nm and about 50 nm. As measured from the lowest point of the edge recess 212R to the highest point of the fins 212, an absolute fin height H may be between about 100 nm and about 200 nm.

In some other embodiments, the groups of semiconductor fins may include a silicon germanium layer or a germanium layer. In those embodiments, method 300 may be used.

Figure 16:
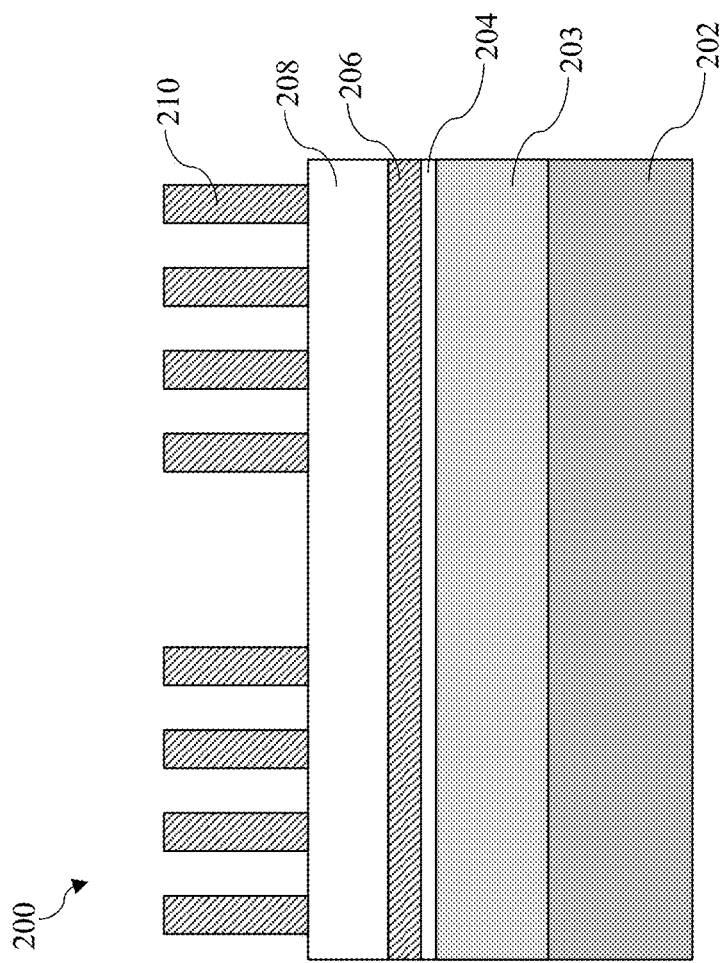
FIGS. 16-27 illustrate fragmentary cross-sectional views or top views of a workpiece during a fabrication process according to the method of FIG. 15, according to one or more aspects of the present disclosure.

Referring to FIGS. 15 and 16, method 300 includes a block 302 where a workpiece 200 is provided. As shown in FIG. 16, the workpiece 200 includes a substrate 202, a semiconductor layer 203 over the substrate 202, a pad oxide layer 204 over the semiconductor layer 203, a pad nitride layer 206 over the pad oxide layer 204, an oxide mask layer 208 over the pad nitride layer 206, and a nitride mask layer 210 over the oxide mask layer 208. The substrate 202 may be a silicon (Si) substrate. In some other embodiments, the substrate 202 may include a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. A composition of the semiconductor layer 203 is different from a composition of the substrate 202. In some embodiments, the semiconductor layer 203 may include germanium (Ge) or silicon germanium (SiGe). The pad oxide layer 204, pad nitride layer 206, oxide mask layer 208, and nitride mask layer 210 shown in FIG. 16 are similar to their counterparts shown in FIG. 2. Detailed descriptions of them are omitted for brevity. The oxide mask layer 208 and nitride mask layer 210 are thicker than the pad oxide layer 204 and pad nitride layer 206 as they function as mask layers. The pad oxide layer 204 and pad nitride layer 206 are thinner because they function as etch stop layers for the removal of the oxide mask layer 208.

Referring to FIGS. 15 and 16, method 300 includes a block 304 where the nitride mask layer 210 is patterned. Operations at block 304 are similar to those at block 104. Detailed description of the operations at block 304 are therefore omitted for brevity.

Figure 17:
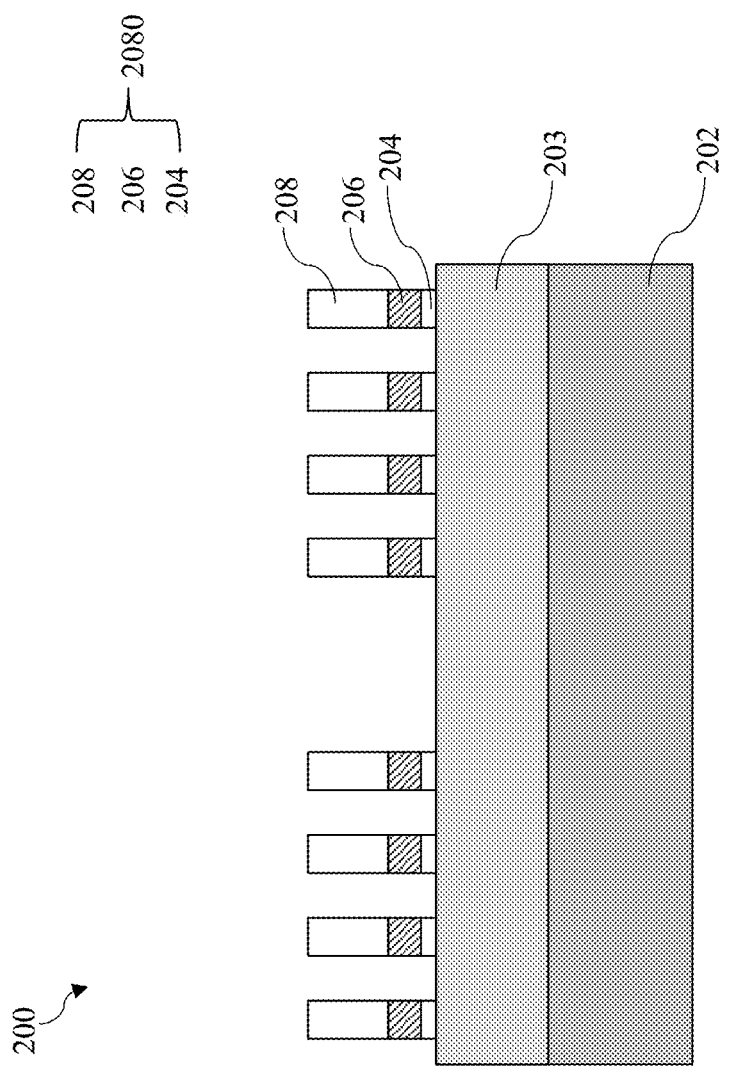

Referring to FIGS. 15 and 17, method 300 includes a block 306 where the oxide mask layer 208, the pad nitride layer 206, and the pad oxide layer 204 are patterned using the patterned nitride mask layer 210 as an etch mask. Operations at block 306 are similar to those at block 106. Detailed description of the operations at block 306 are therefore omitted for brevity. Upon conclusion of the operations at block 306, a patterned oxide mask layer 2080 is formed.

Figure 18:
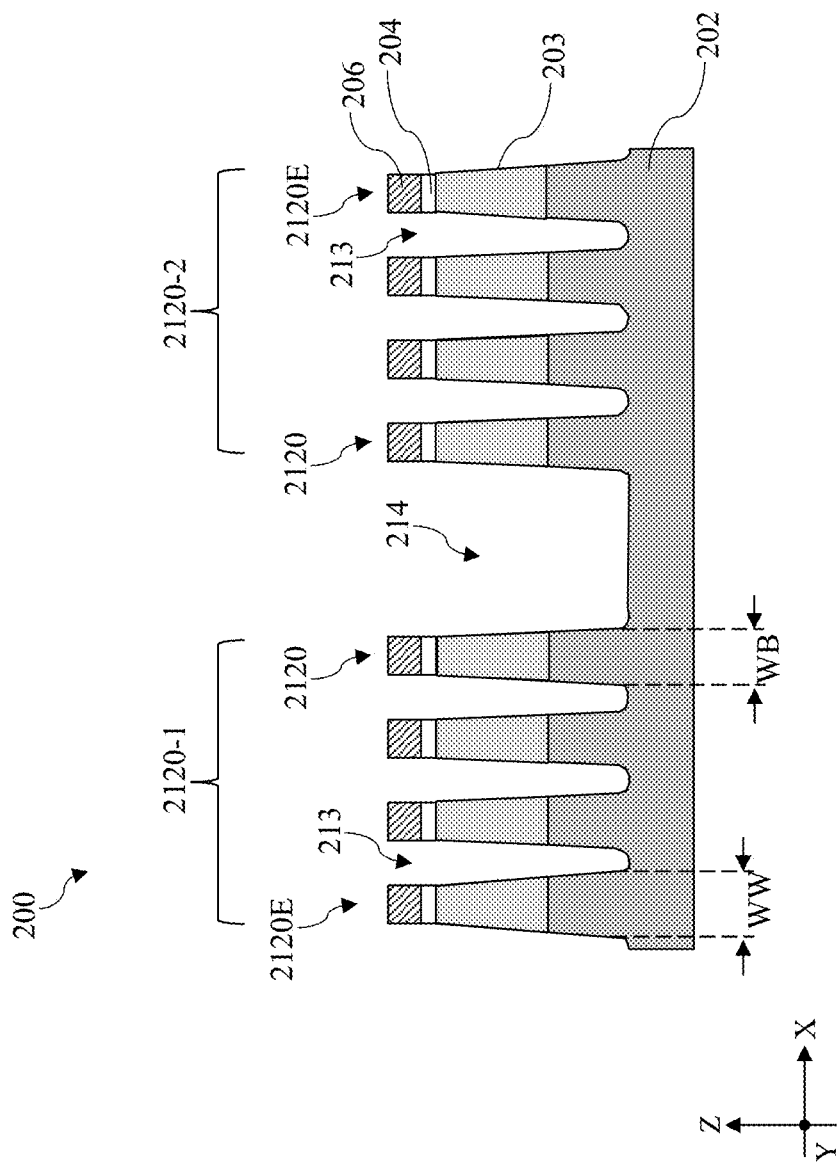

Referring to FIGS. 15 and 18, method 300 includes a block 308 where the semiconductor layer 203 and the substrate 202 are patterned to form groups of heterogeneous fins. At block 308, the substrate 202 and the semiconductor layer 203 are anisotropically etched using the patterned oxide mask layer 2080 as an etch mask. In some embodiments, the anisotropic etch may be performed using an RIE process that uses oxygen, hydrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 18, the anisotropic etching may form groups of heterogeneous fins, such as a first group of heterogeneous fins 2120-1 and a second group of heterogeneous fins 2120-2. The first group of heterogeneous fins 2120-1 is spaced apart from the second group of heterogeneous fins 2120-2 by an opening 214. The first group of heterogeneous fins 2120-1 includes heterogeneous fins 2120 and an edge heterogeneous fin 2120E, which are interleaved by trenches 213. The edge heterogeneous fin 2120E may also be referred to as an outer heterogeneous fin 2120E. Similarly, the second group of heterogeneous fins 2120-2 includes heterogeneous fins 2120 and an edge heterogeneous fin 2120E, which are interleaved by trenches 213. Compared to fins 212 that are formed from the substrate 202 alone, the heterogeneous fins 2120 and edge heterogeneous fins 2120E are formed from not only the substrate 202 but also the semiconductor layer 203. As a result, each of them includes a lower portion formed of the substrate 202 and a top portion formed of the semiconductor layer 203. In the depicted embodiment, the heterogeneous fins (of the first group of heterogeneous fins 2120-1 and the second group of heterogeneous fins 2120-2) that are adjacent the opening 214 are not considered edge fins, especially when a width of the opening 214 is smaller than about 55 nm. As shown in FIG. 18, a portion of the pad oxide layer 204 and a portion of the pad nitride layer 206 may remain disposed over the heterogeneous fins 2120 or edge heterogeneous fins 2120E. In the depicted embodiments, the oxide mask layer 208 may be substantially removed during the etching of the substrate 202 and the semiconductor layer 203. In the embodiments represented in FIG. 18, the heterogeneous fins 2120 and the edge heterogeneous fins 2120E may have tapered sidewalls and may have similar height. The height of the heterogeneous fins 2120 and the edge heterogeneous fins 2120E may be between about 50 nm and about 150 nm, exclusive of the thicknesses of the pad oxide layer 204 and the pad nitride layer 206. Additionally, due to etch loading effect, each of the edge heterogeneous fins 2120E may be greater in width than each of the heterogeneous fins 2120. For example, each of the edge heterogeneous fins 2120E may have bottom fin width WW and each of the heterogeneous fins 2120 may have a bottom fin width WB. The bottom fin width WW of each of the edge heterogeneous fin 2120E may be greater than the bottom fin width WB of each of the heterogeneous fins 2120. In some instances, the bottom fin width WW may be between about 12 nm and about 25 nm and the bottom fin width WB may be between about 10 nm and about 20 nm.

Figure 19:
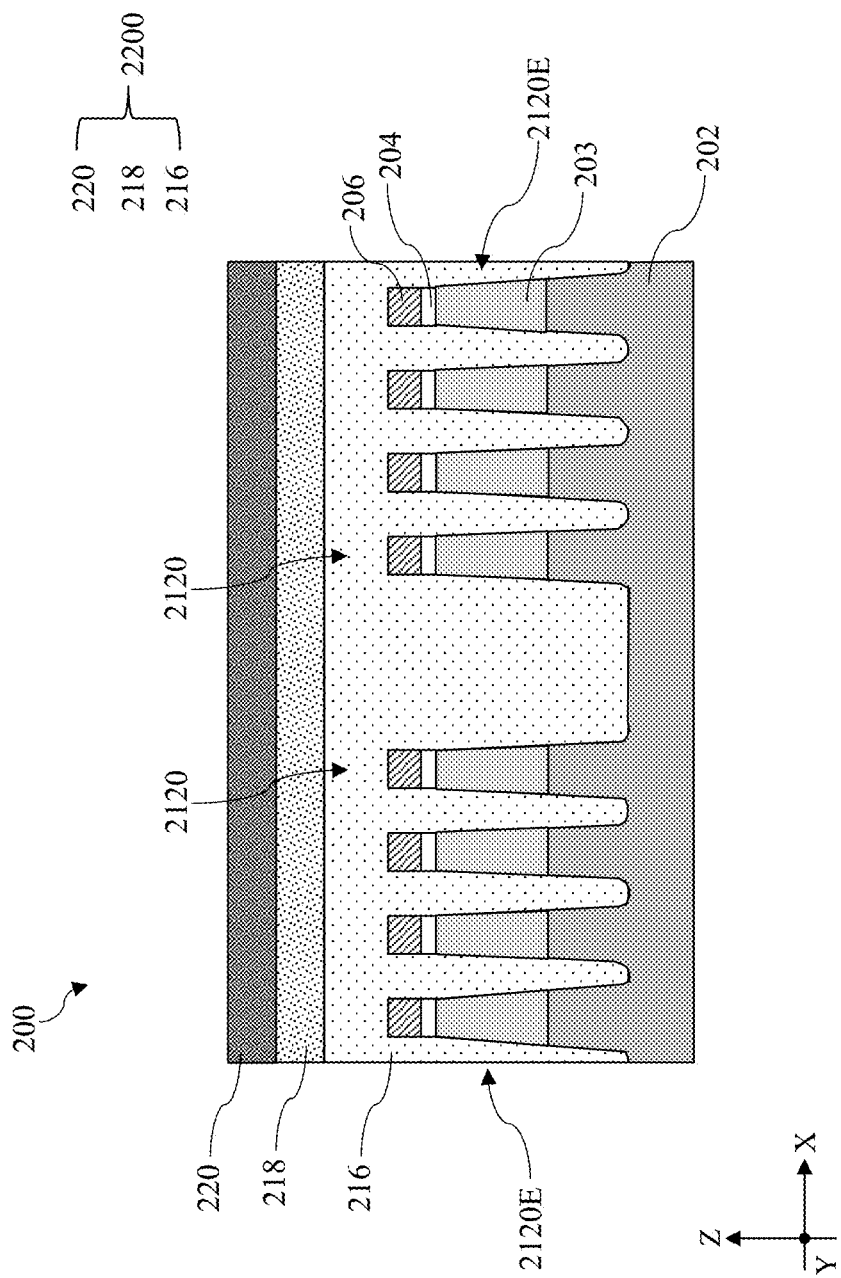

Referring to FIGS. 15 and 19, method 300 includes a block 310 where a mask layer 2200 is deposited over the workpiece 200. In the depicted embodiment, the mask layer 2200 is a multi-layer and includes a bottom layer 216, a middle layer 218, and a photoresist layer 220. The bottom layer 216, middle layer 218, and photoresist layer 220 shown in FIG. 19 are similar to their counterparts shown in FIG. 5. Detailed descriptions of them are omitted for brevity.

Figure 20:
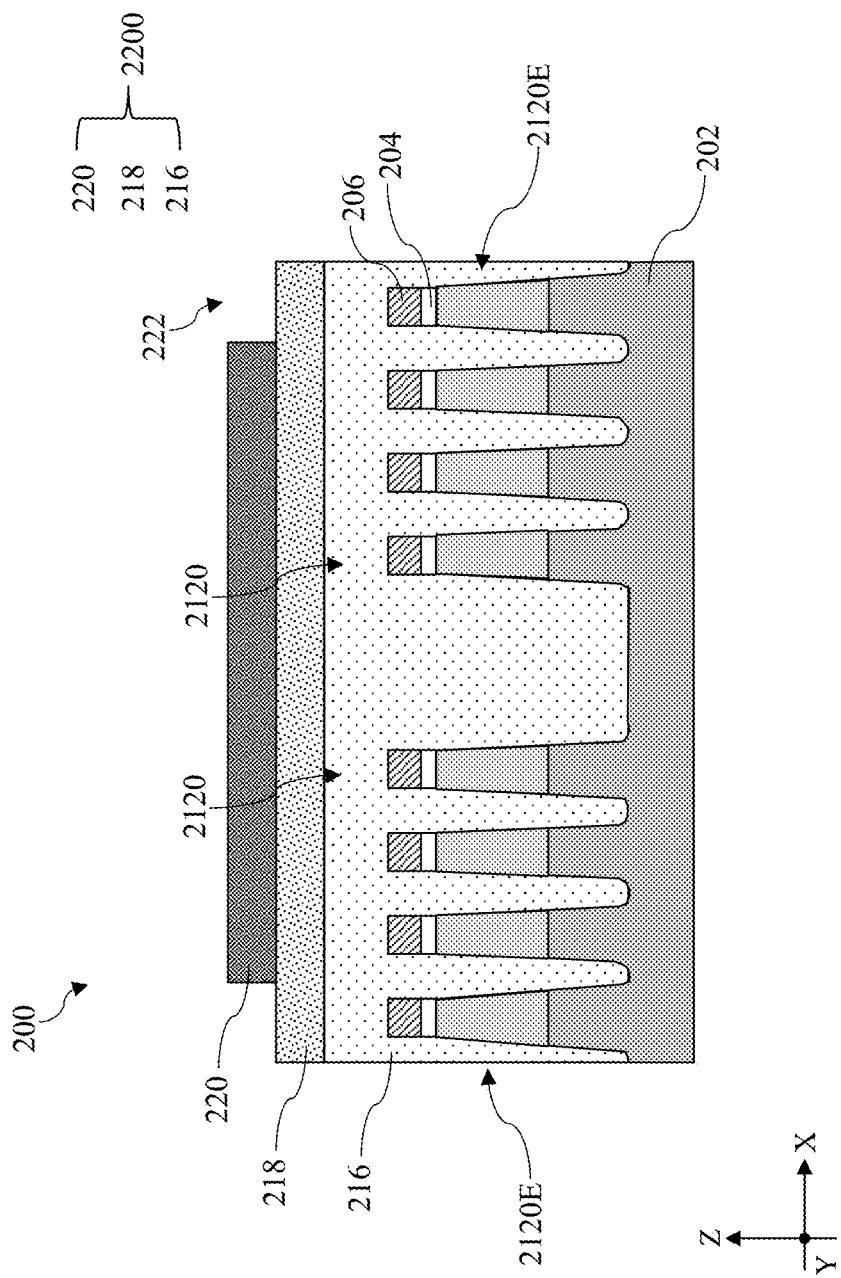
Figure 21:
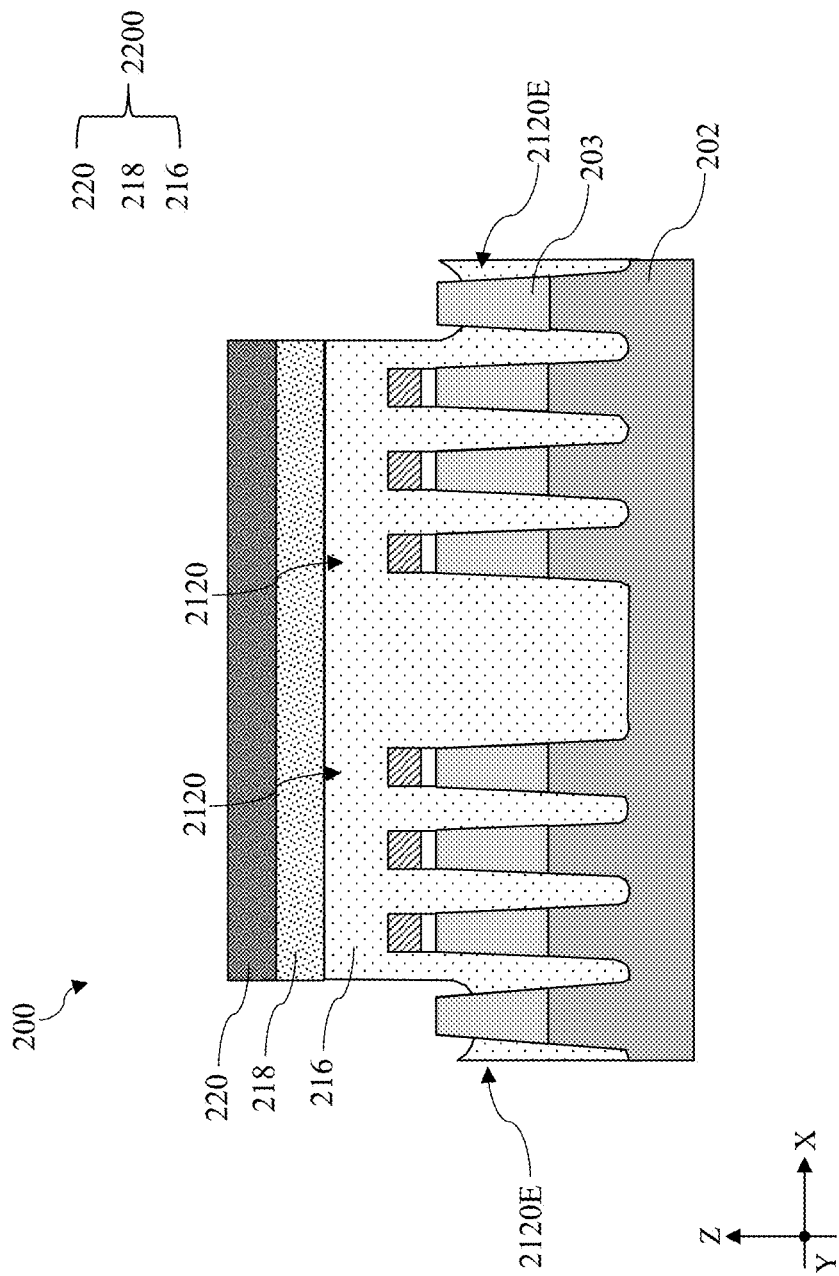

Referring to FIGS. 15, 20 and 21, method 300 includes a block 312 where the mask layer is patterned to expose an outer fin of each group of fins. Operations at block 312 are similar to those at block 112. Detailed description of the operations at block 312 are therefore omitted for brevity.

Figure 22:
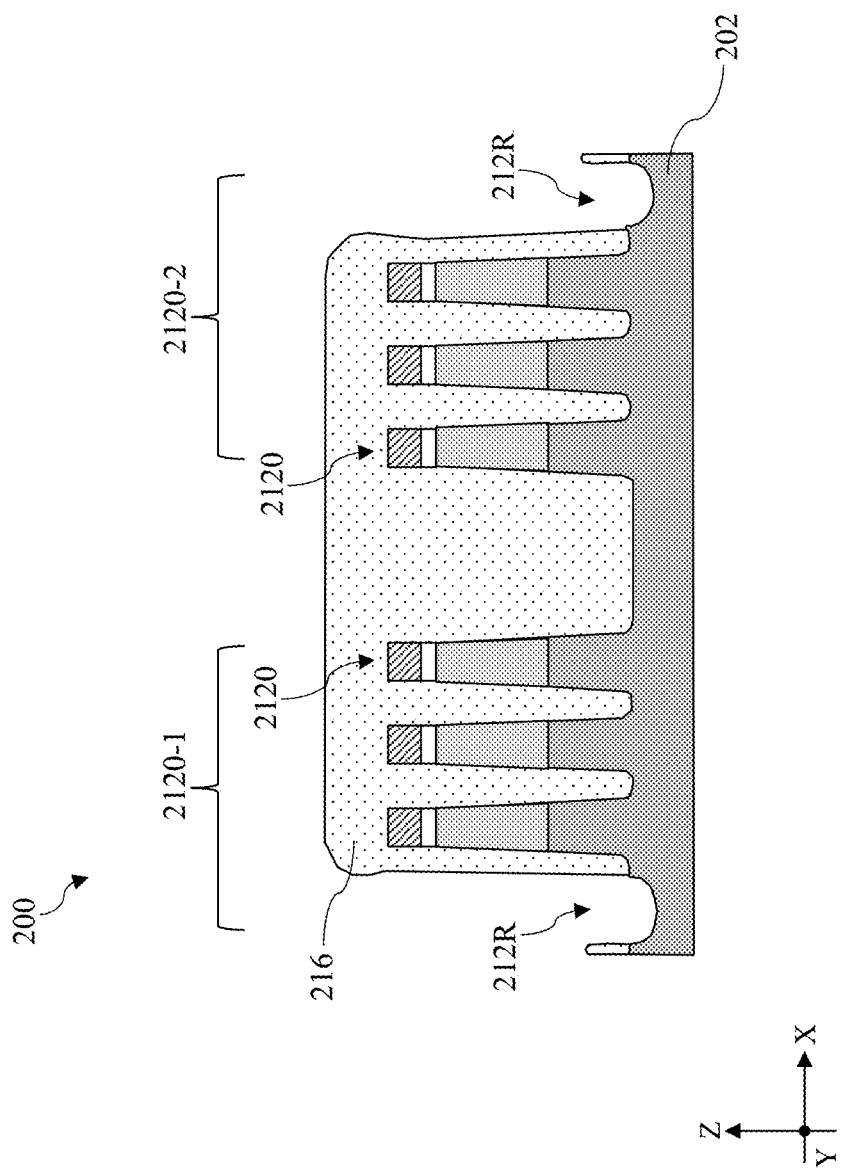

Referring to FIGS. 15 and 22, method 300 includes a block 314 where the outer fin 2120E is removed. Operations at block 314 are similar to those at block 114. Detailed description of the operations at block 314 are therefore omitted for brevity. It is noted that because the semiconductor layer 203 etches faster than the substrate 202, the edge heterogeneous fins 2120E etch faster than the edge fins 212E. As illustrated in FIG. 22, the removal of the edge heterogeneous fins 2120E leaves behind edge recesses 212R.

Figure 23:
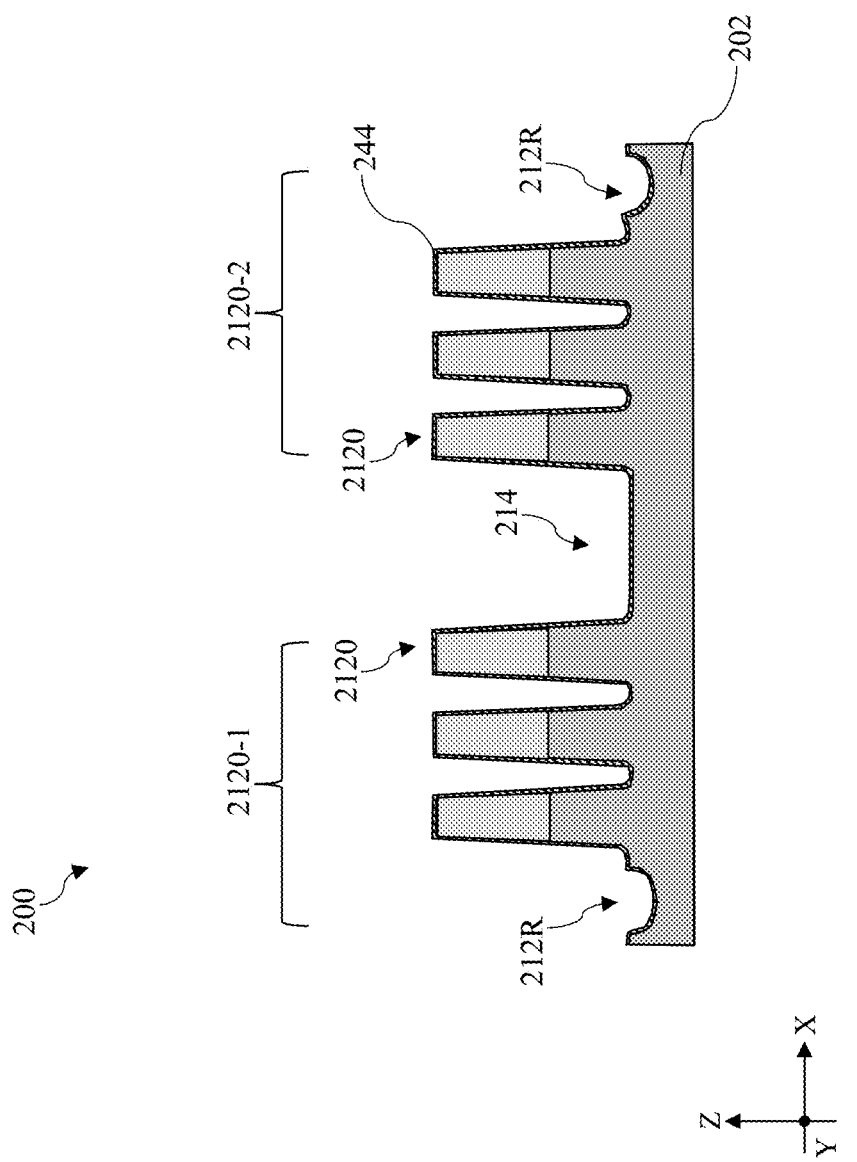
Figure 24:
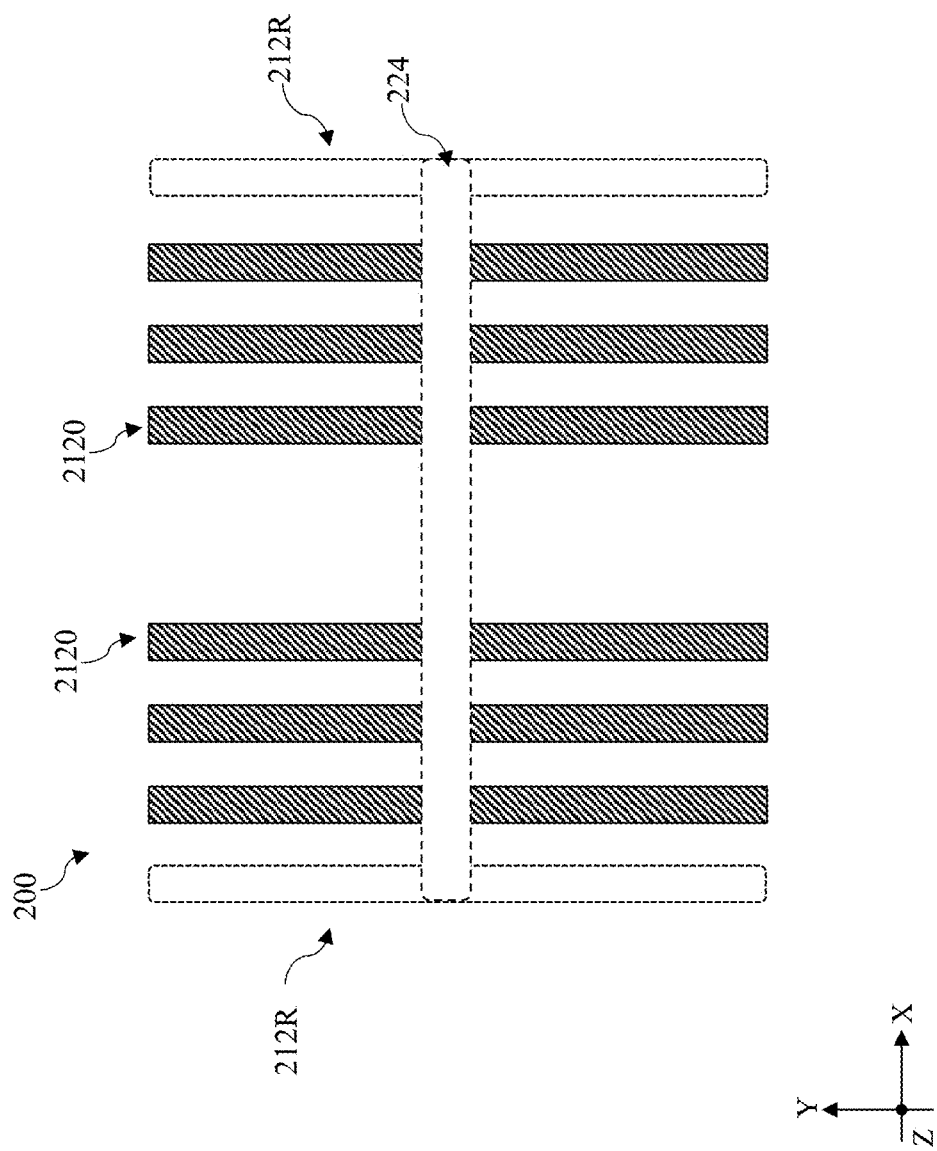
Figure 25:
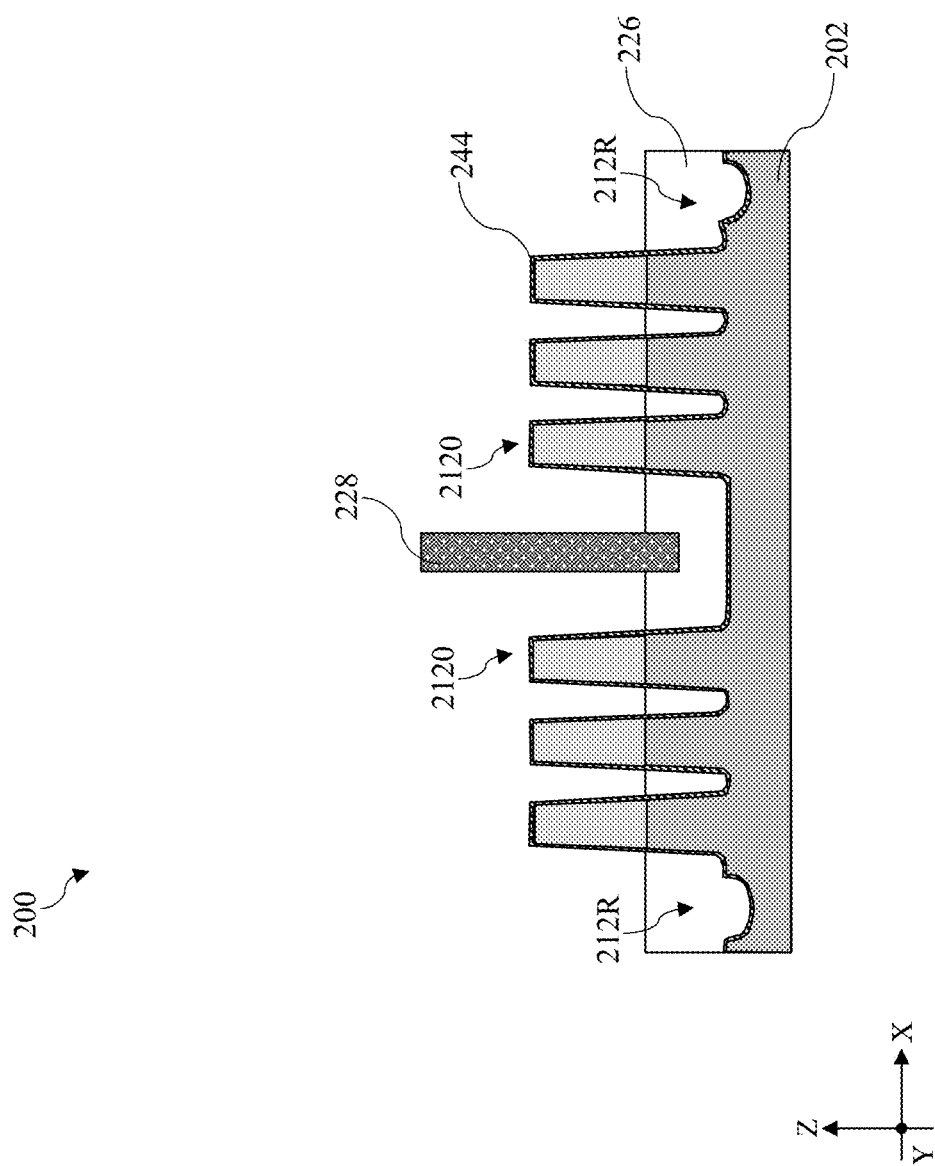
Figure 26:
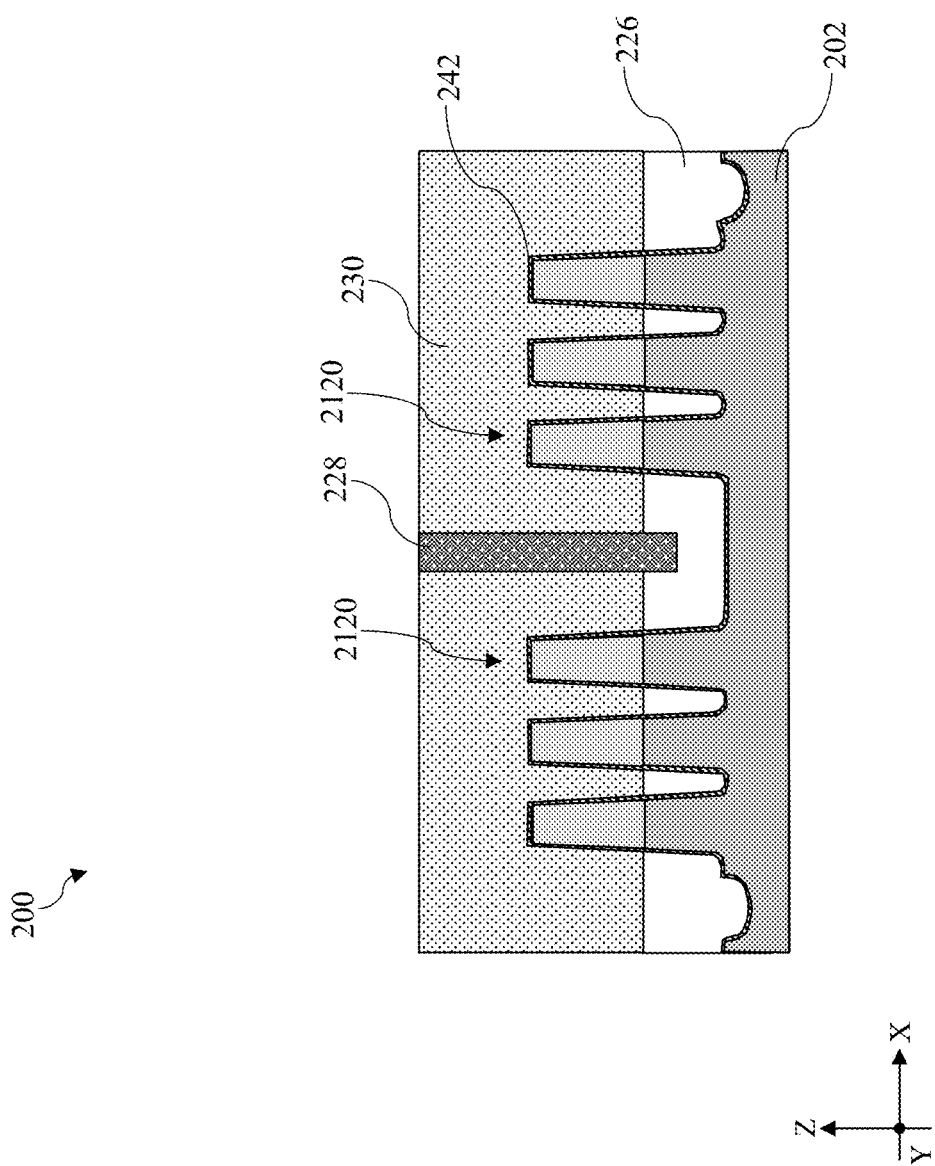

Referring to FIGS. 15 and 23, method 300 includes a block 316 where the bottom layer 216 is selectively removed. Operations at block 316 are similar to those at block 116. Detailed description of the operations at block 314 are therefore omitted for brevity.

Referring to FIGS. 15 and 23, method 300 includes a block 318 where a silicon liner 244 is deposited over the workpiece 200. In some embodiments, the silicon liner 244 may be epitaxially deposited using CVD deposition techniques (e.g., vapor-phase epitaxy (VPE) and/or ultra-high vacuum CVD (UHV-CVD), molecular beam epitaxy (MBE), and/or other suitable processes. In some other embodiments, the silicon liner 244 may be deposited using CVD.

Referring to FIGS. 1, 24, 25, 26, and 27, method 300 includes a block 320 where further processes are performed. Such further processes may include a fin coarse cut process (shown in FIG. 24), formation of an isolation feature 226 among the heterogeneous fins 2120 (shown in FIG. 25), formation of a dielectric fin 228 over the isolation feature 226 (shown in FIG. 25), formation of a dummy gate stack 230 (shown in FIG. 26), formation of source/drain features (not explicitly shown), and replacement of the dummy gate stack 230 with gate structures 238 and 240 (shown in FIG. 27). Operations at block 320 are similar to those at block 118. Detailed description of the operations at block 320 are therefore omitted for brevity. In some embodiments represented in FIG. 27, the first gate structure 240 is configured to control a transistor that includes three heterogeneous fins 2120 in the first group of heterogeneous fins 2120-1 and the second gate structure 242 is configured to control another transistor that includes three heterogeneous fins 2120 in the second ground of heterogeneous fins 2120-2. In the depicted embodiment, each of the first gate structure 240 and the second gate structure 242 extend over the edge recesses 212R, which are now filled with the isolation feature 226.

Figure 27:
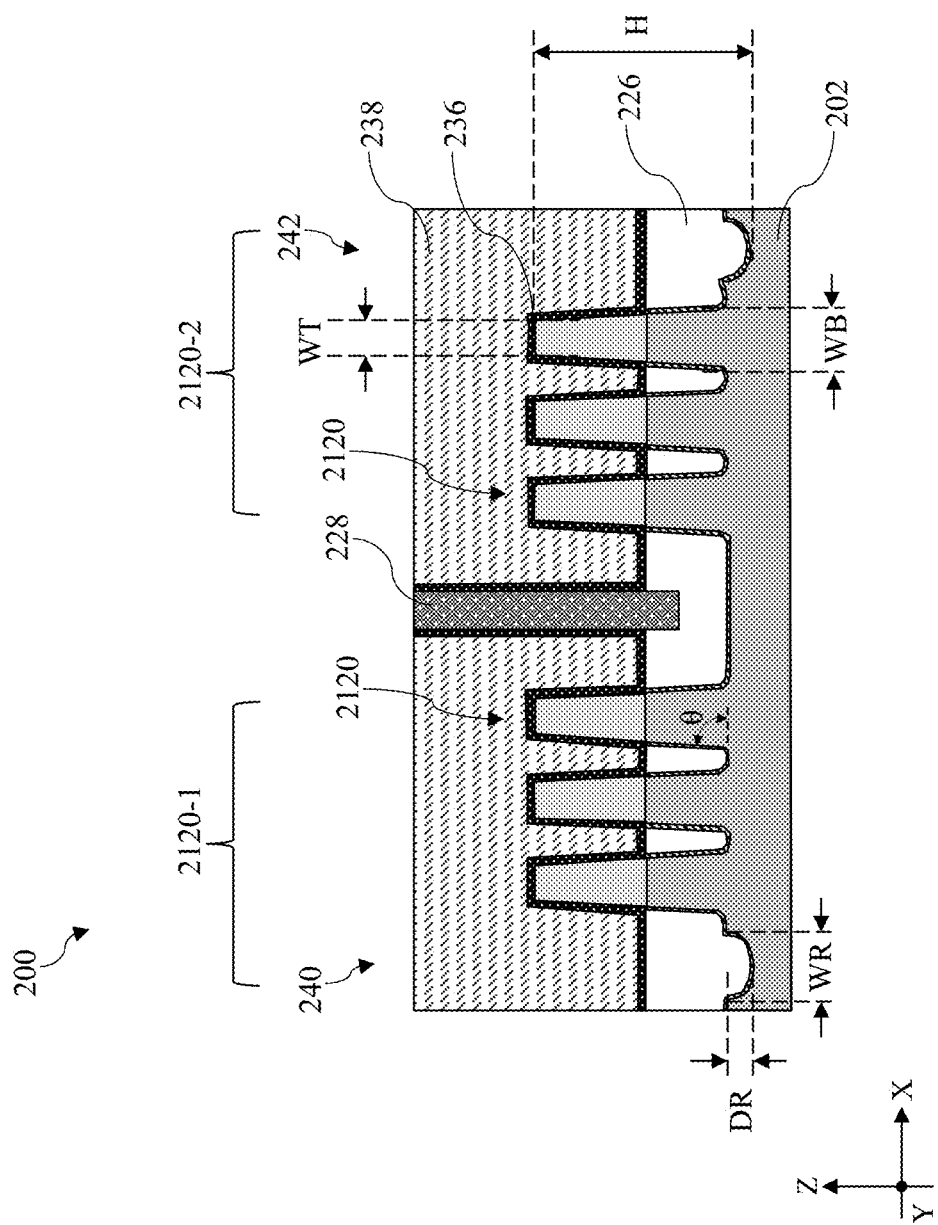
Figure 28:
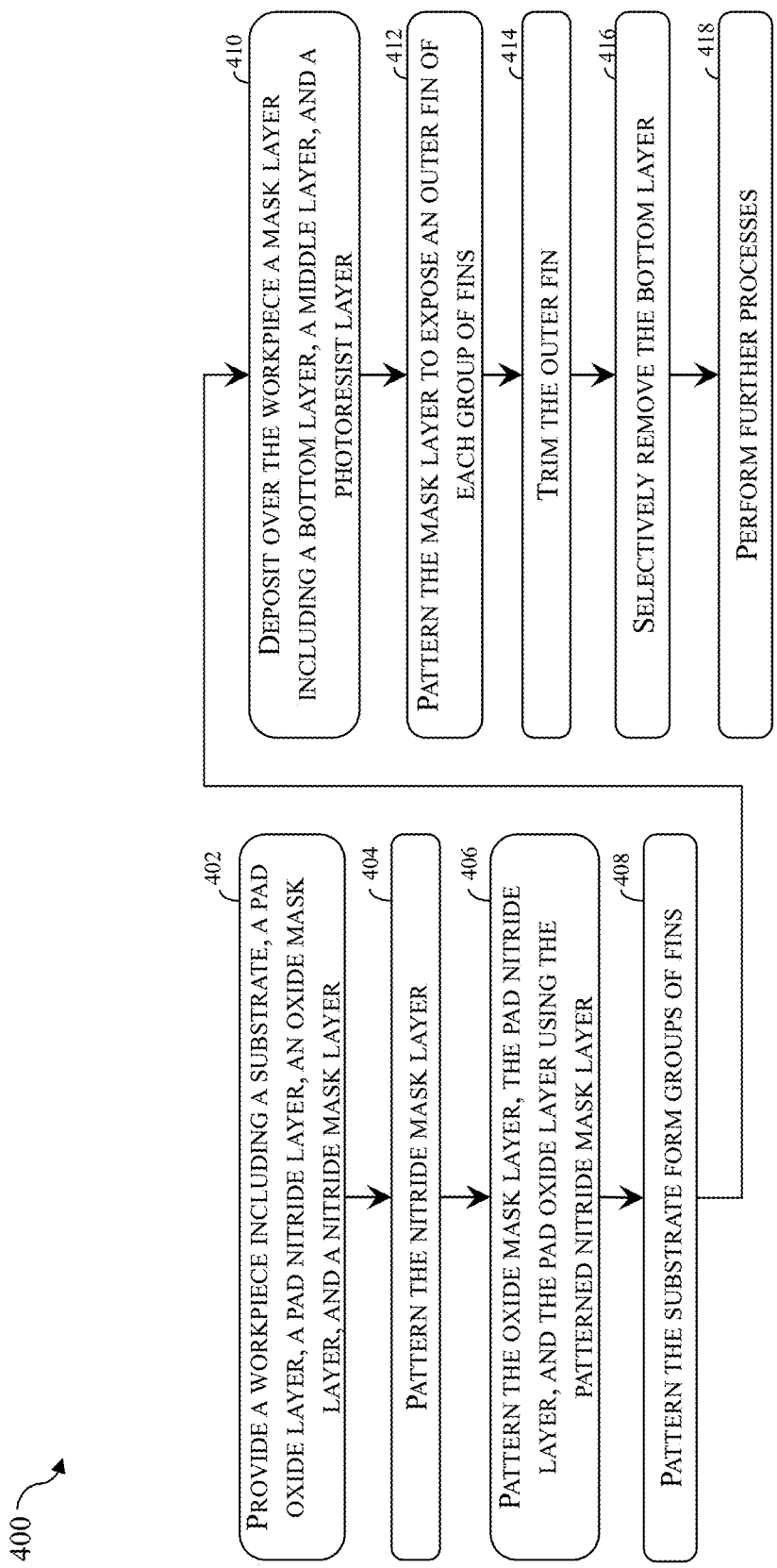
FIG. 28 illustrates a flow chart of a method for forming a semiconductor structure having a plurality of semiconductor fins, according to one or more aspects of the present disclosure.

Reference is still made to FIG. 27. Because the wider edge heterogeneous fins 2120E have been removed at block 314 of method 300, the heterogeneous fins 212 in the first group of heterogeneous fins 2120-1 and the second group of heterogeneous fins 2120-2 are substantially uniform in size, profile angles, and shapes. As shown in FIG. 27, each of the heterogeneous fins 2120 may include a bottom width WB, a top width WT, and a profile angle θ. In some instances, the bottom width WB may be between about 10 nm and about 20 nm, the top width WT may be between about 8 nm and about 19 nm, and the profile angle θ may be between about 83° and about 90°. The edge recesses 212R are now filled by the isolation feature 226. Each of the edge recesses 212R has a width WR and a depth DR. In some instances, the width WR may be between about 15 nm and about 30 nm and the depth DR may be between about 5 nm and about 50 nm. As measured from the lowest point of the edge recess 212R to the highest point of the heterogeneous fins 2120, an absolute fin height H may be between about 100 nm and about 200 nm.

In still other embodiments, outer fins are not removed but only trimmed. In those embodiments, method 400 may be used.

Figure 29:
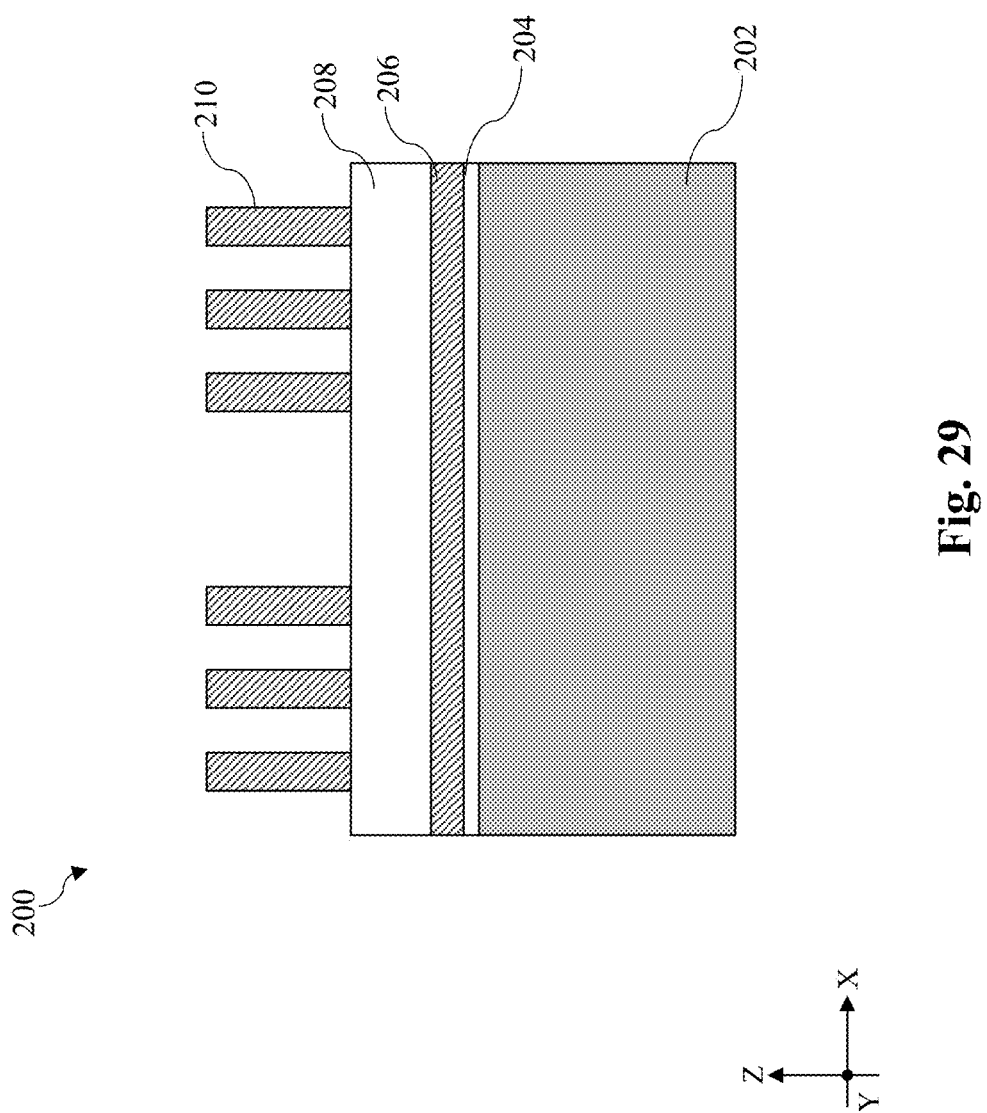
FIGS. 29-41 illustrate fragmentary cross-sectional views or top views of a workpiece during a fabrication process according to the method of FIG. 28, according to one or more aspects of the present disclosure.

Referring to FIGS. 28 and 29, method 400 includes a block 402 where a workpiece 200 is provided. Operations at block 402 are similar to those at block 102. Detailed description of the operations at block 402 are therefore omitted for brevity.

Referring to FIGS. 28 and 29, method 400 includes a block 404 where the nitride mask layer 210 is patterned. Operations at block 404 are similar to those at block 104. Detailed description of the operations at block 404 are therefore omitted for brevity.

Figure 30:
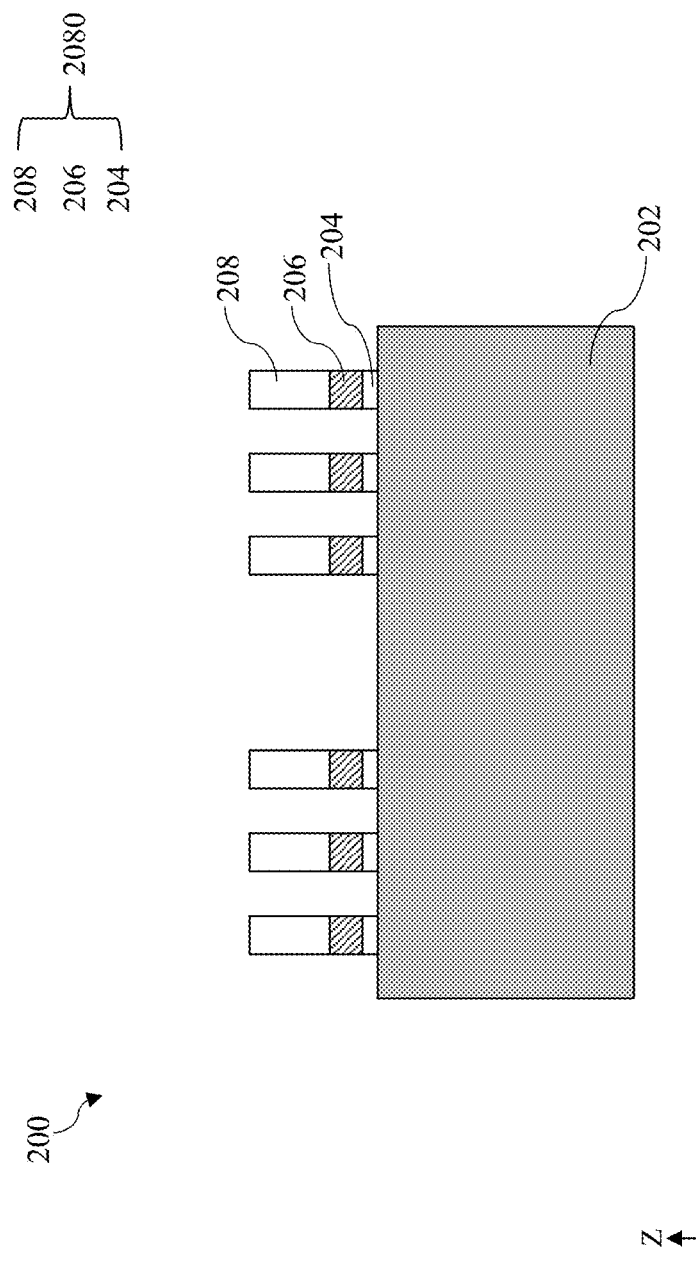

Referring to FIGS. 28 and 30, method 400 includes a block 406 where the oxide mask layer 208, the pad nitride layer 206, and the pad oxide layer 204 are patterned using the patterned nitride mask layer 210 as an etch mask. Operations at block 406 are similar to those at block 106. Detailed description of the operations at block 406 are therefore omitted for brevity. Upon conclusion of the operations at block 406, a patterned oxide mask layer 2080 is formed.

Figure 31:
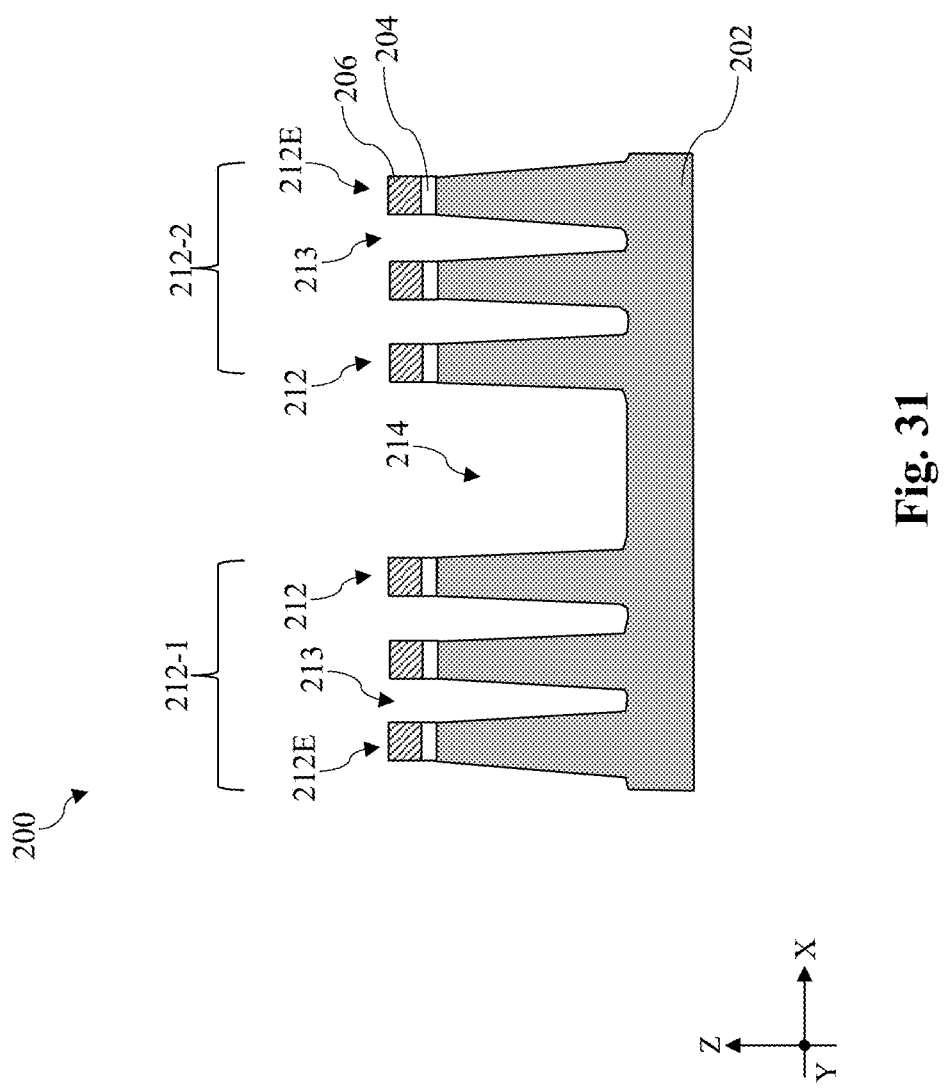

Referring to FIGS. 28 and 31, method 400 includes a block 408 where the substrate 202 are patterned to form groups of fins 212. Operations at block 408 are similar to those at block 108. Detailed description of the operations at block 408 are therefore omitted for brevity. It is noted that because method 400 trims the edge fins 212E rather than removing them, the number of fins in the first group of fins 212-1 and the second group of fins 212-2 remain the same throughout operations in method 400. When method 100 or method 300 is adopted, at least one additional fin 212 or heterogeneous fin 2120 is formed such that the number of fins or heterogeneous fins meet the desired number after the removal of the edge fins 212E or edge heterogeneous fins 2120E. In the depicted embodiment, three fins 212 are desired in each group of fins and three fins 212, no more and no less, are formed at block 408, as shown in FIG. 31.

Figure 32:
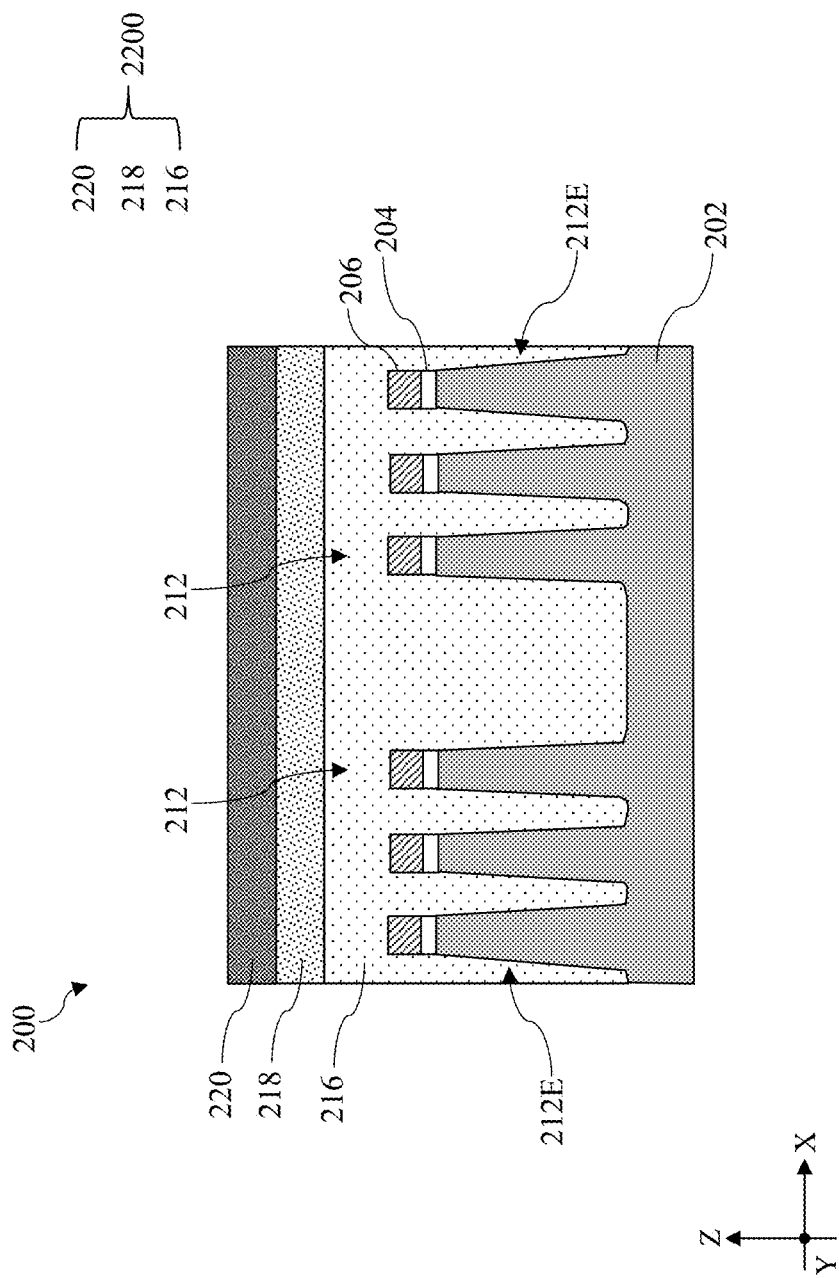
Figure 33:
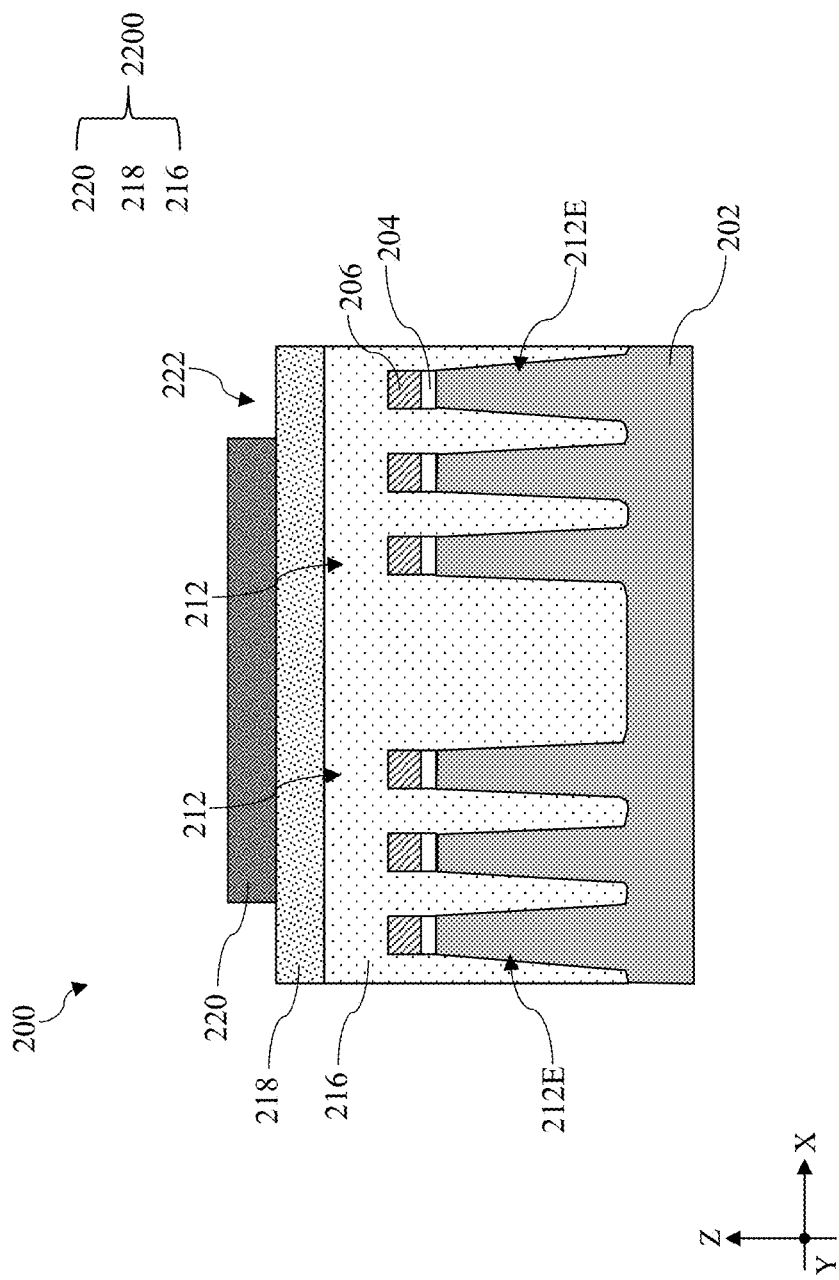
Figure 34:
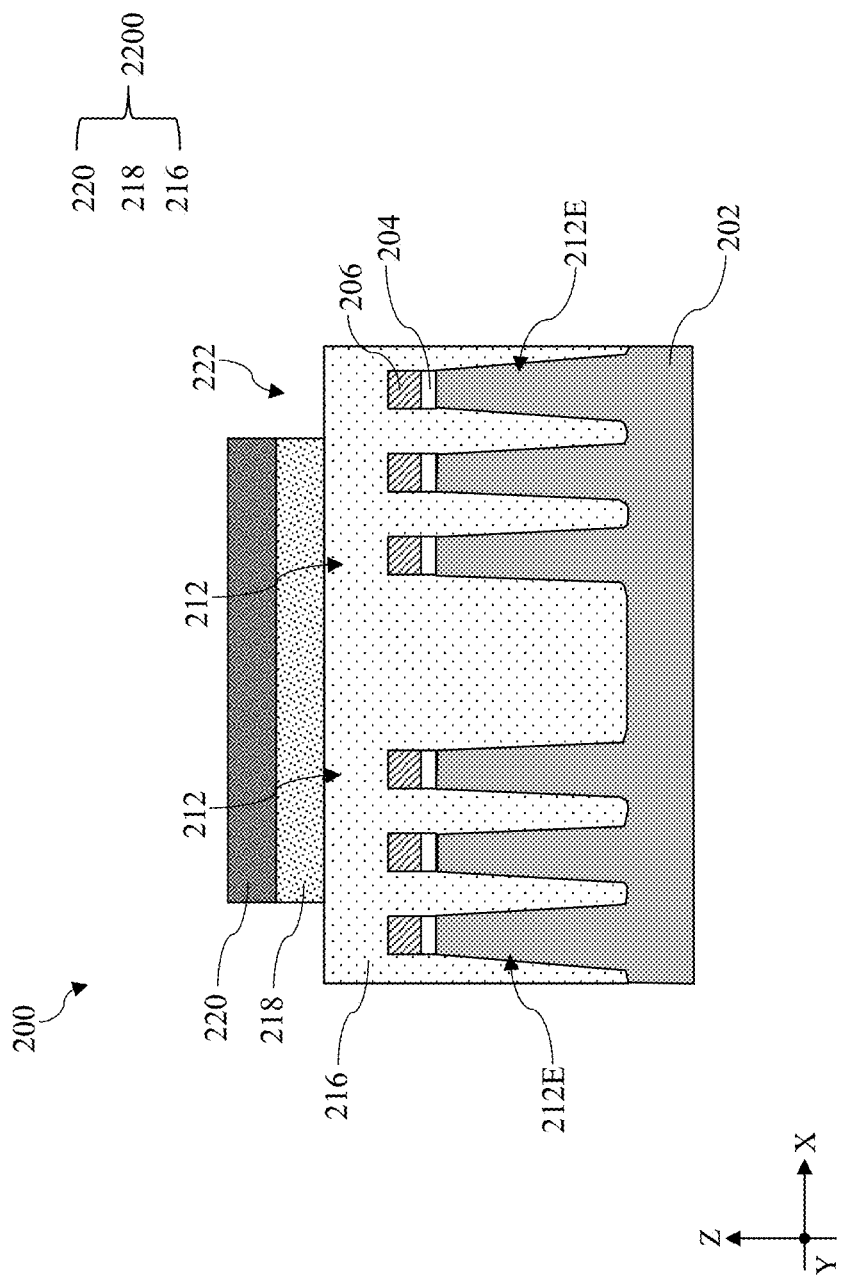
Figure 35:
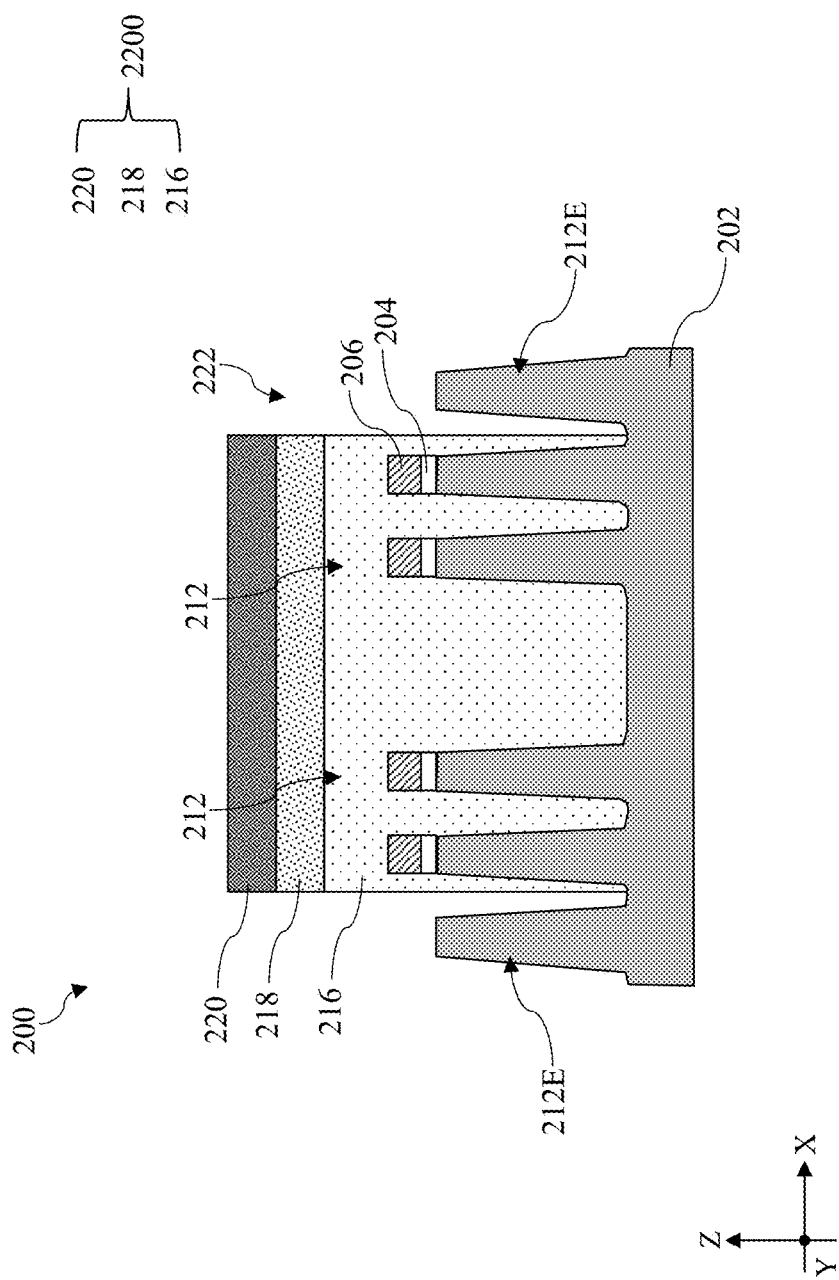

Referring to FIGS. 28 and 32, method 400 includes a block 410 where a mask layer 2200 is deposited over the workpiece 200. Operations at block 410 are similar to those at block 110. Detailed description of the operations at block 410 are therefore omitted for brevity.

Referring to FIGS. 28, 33, 34, and 35, method 400 includes a block 412 where the mask layer 2200 is patterned to expose an outer fin 212E of each group of fins. Operations at block 412 are similar to those at block 112. Operations at block 412 are different from those at block 112 in that, at block 412, the bottom layer 216 over and around the edge fins 212E are further etched to expose sidewalls of the edge fins 212E. The full exposure of the sidewalls of the edge fins 212E allows trimming of the edge fins 212E at block 414.

Figure 36:
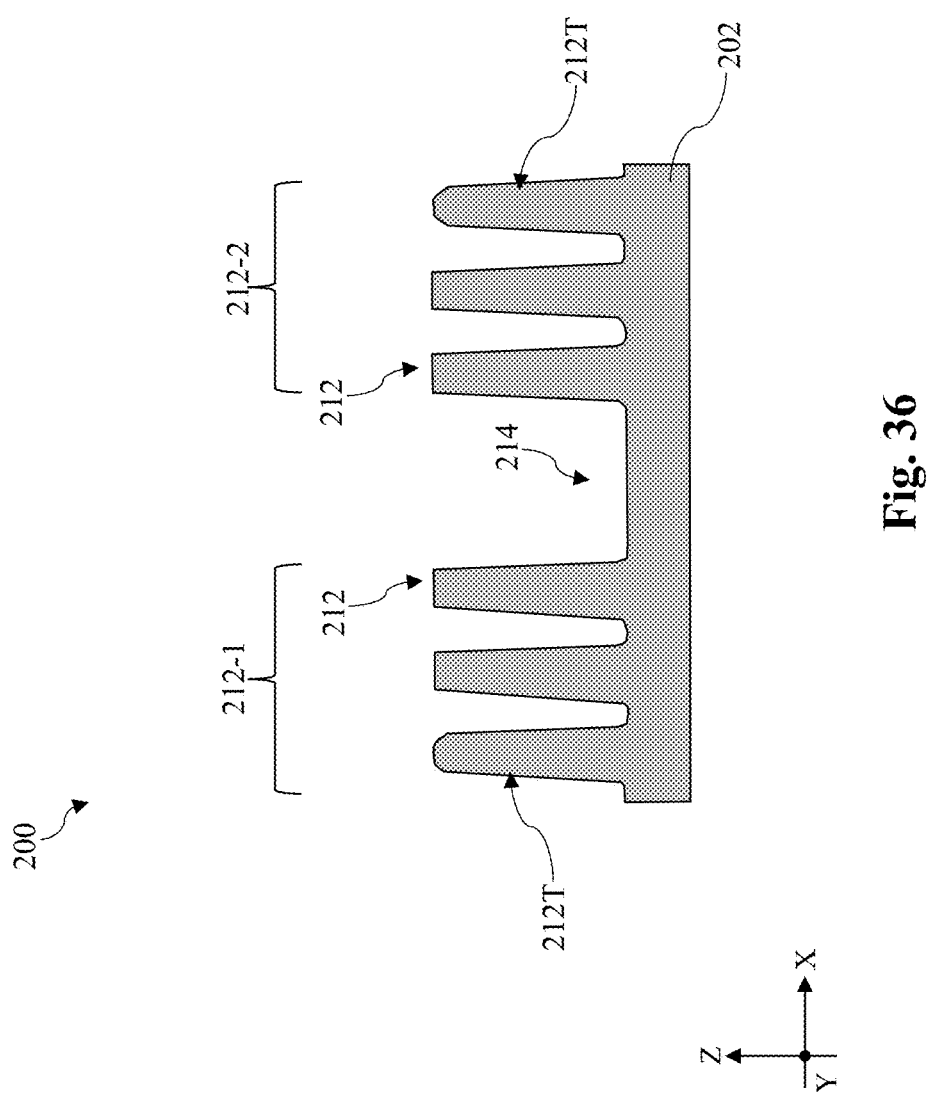
Figure 37:
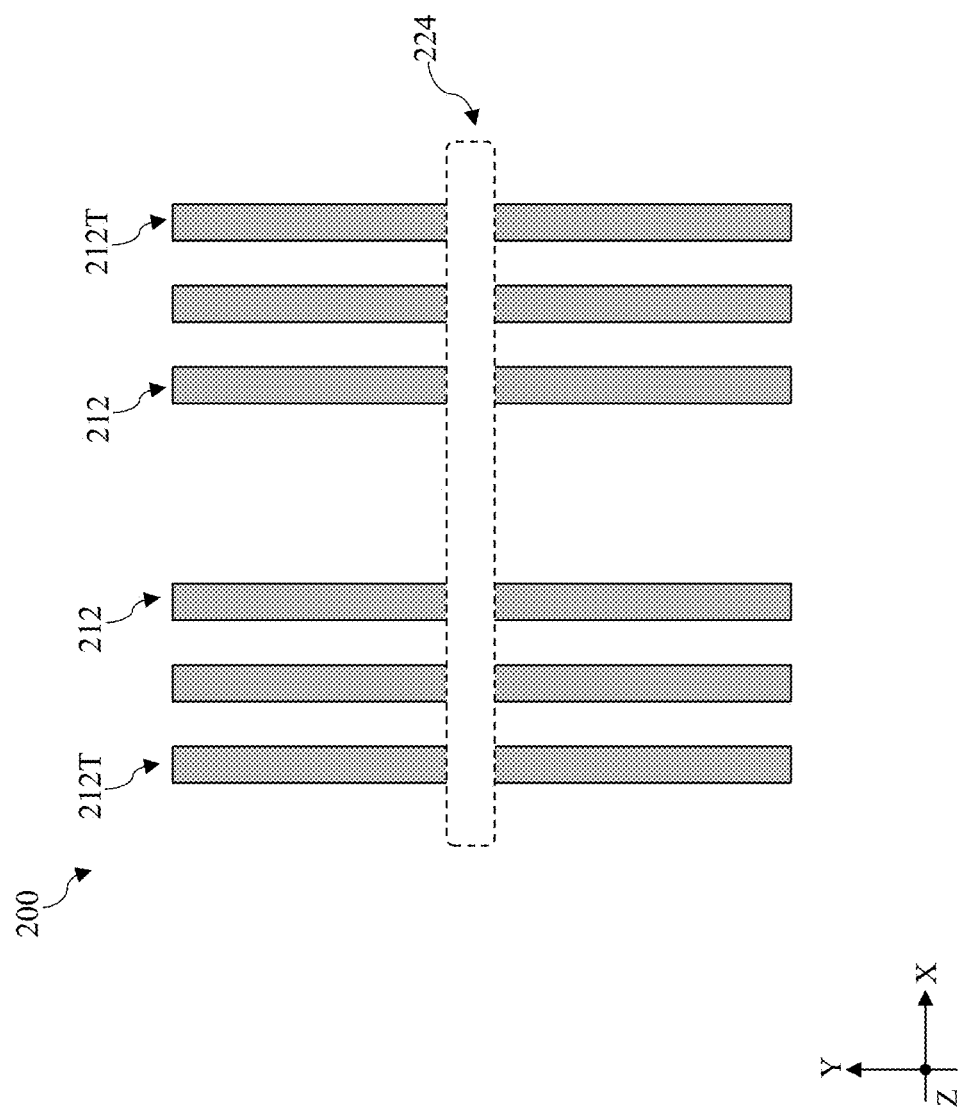
Figure 38:
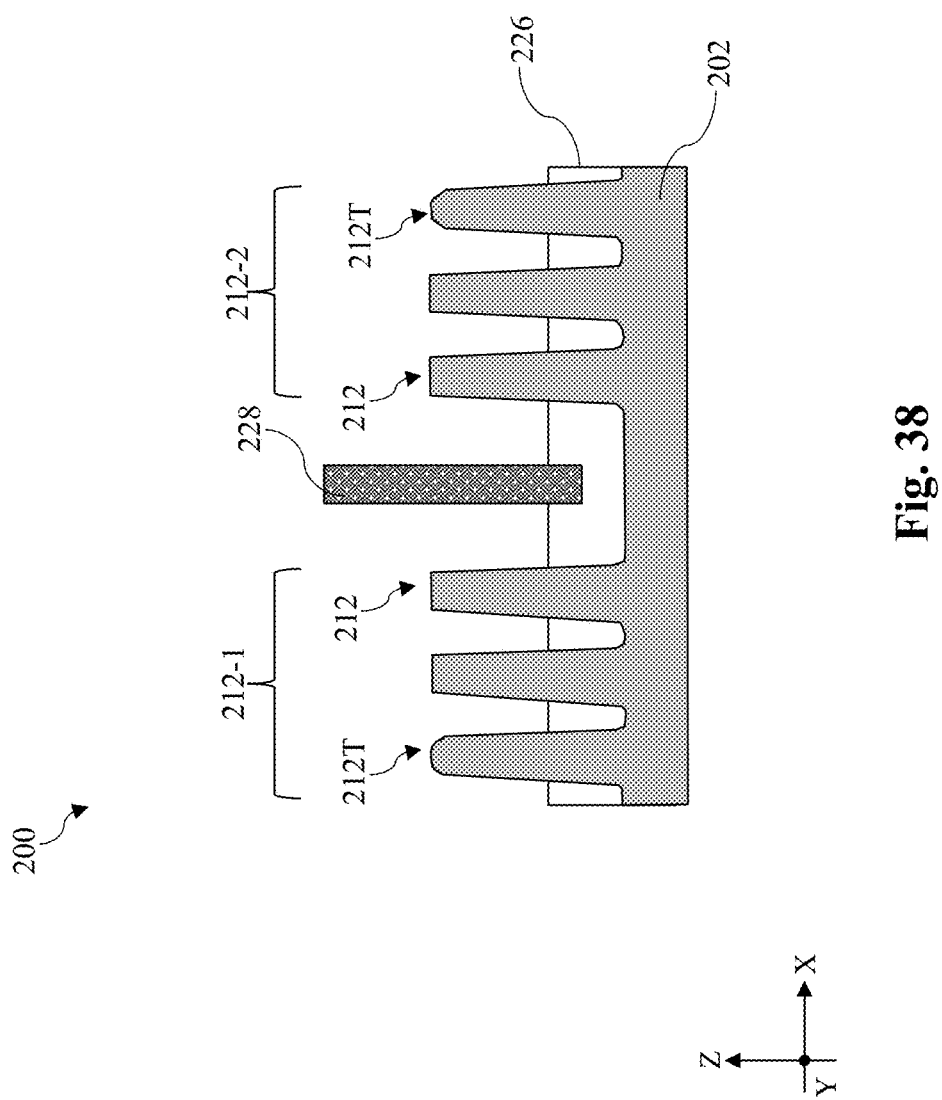
Figure 39:
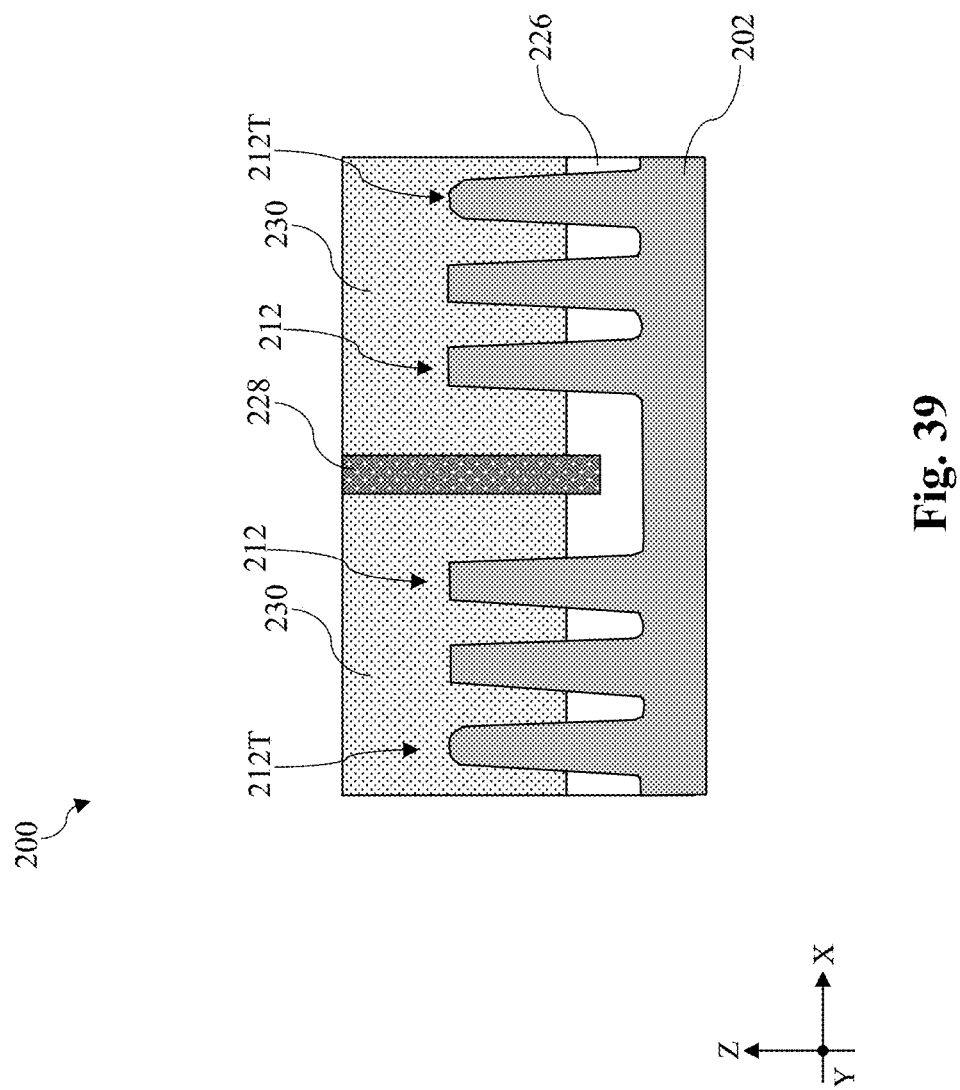
Figure 40:
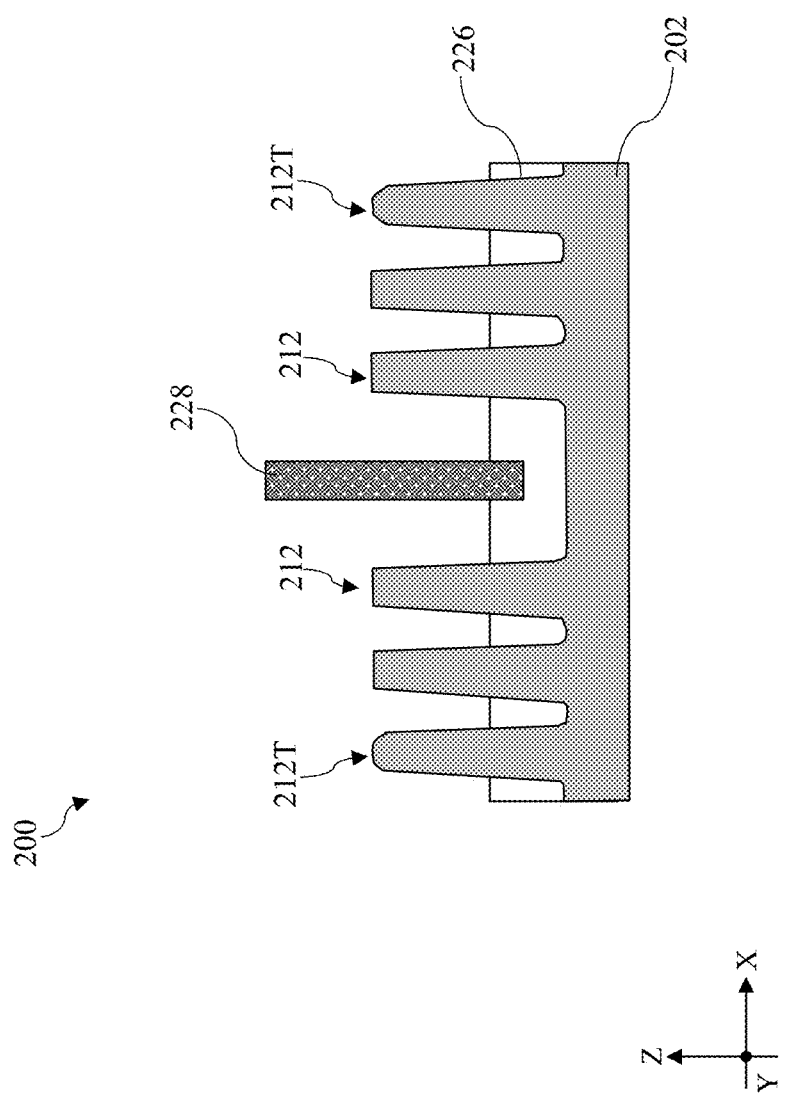

Referring to FIGS. 28 and 36, method 400 includes a block 414 where the outer fins 212E are trimmed. At block 414, the patterned mask layer 2200 is applied as a trimming mask in trimming the outer fins 212E in the first group of fins 212-1 and the second group of fins 212-2. In some embodiments, the outer fins 212E are trimmed using an isotropic wet etch process or an isotropic dry etch process. An example isotropic wet etch process includes use of ethylenediamine pyrocatechol EDP), tetramethylammonium hydroxide (TMAH), nitric acid ($HNO_3$), hydrofluoric acid (HF), ammonia ($NH_3$), ammonium fluoride ($NH_4F$) or a suitable wet etchant. An example isotropic dry etch process includes use of a fluorine-containing gas (e.g., $CF_4$, $NF_3$, $SF_6$, $CH_2F_2$, $CH_3F$, $CHF_3$, and/or $C_2F_6$), argon (Ar), helium (He), sulfur dioxide ($SO_2$), ammonia ($NH_3$), or methane ($CH_4$). As illustrated in FIG. 36, the trimming at block 414 slightly etches the edge fins 212E from all directions to form the thinner trimmed fins 212T. The etch parameters at block 414 are selected such that dimensions of a trimmed fin 212T are similar to those of a fin 212. In the depicted embodiment, due to the use of isotropic etch processes, top surfaces of the trimmed fins 212T may be more rounded than the fins 212, as shown in FIG. 36.

Referring to FIGS. 28 and 36, method 400 includes a block 416 where the bottom layer 216 is selectively removed. Operations at block 416 are similar to those at block 116. Detailed description of the operations at block 416 are therefore omitted for brevity.

Referring to FIGS. 1, 37, 38, 39, 40, and 41, method 400 includes a block 418 where further processes are performed. Operations at block 418 are similar to those at block 118. In some embodiments represented in FIG. 41, the first gate structure 240 is configured to control a transistor that includes two fins 212 and one trimmed fin 212T in the first group of fins 212-1 and the second gate structure 242 is configured to control another transistor that includes two fins 212 and one trimmed fin 212T in the second ground of fins 212-2. Because no edge recesses 212R are formed, none of the first gate structure 240 and the second gate structure 242 extends over any edge recesses similar to the edge recesses 212R shown in FIG. 27 or 41.

Figure 41:
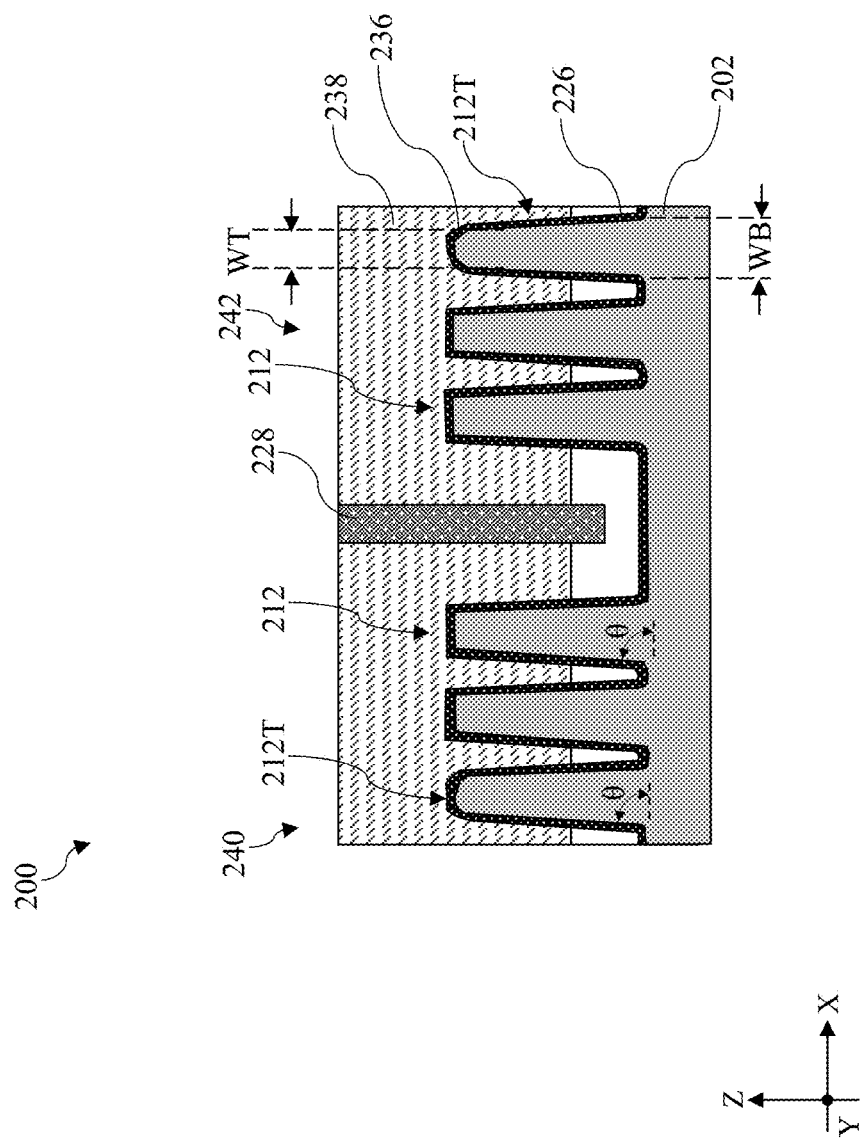

Reference is now made to FIG. 41. Because the wider edge fins 212E have been trimmed down at block 414 to form trimmed fins 212T, the fins 212 and the trimmed fin 212T in the first group of fins 212-1 and the second group of fins 212-2 are substantially uniform in size, profile angles, and shapes. As shown in FIG. 41, each of the fins 212 and the trimmed fins 212T may include a bottom width WB, a top width WT, and a profile angle $\theta$. In some instances, the bottom width WB may be between about 10 nm and about 20 nm, the top width WT may be between about 8 nm and about 19 nm, and the profile angle $\theta$ may be between about 83° and about 90°. The edge recesses 212R are now filled by the isolation feature 226. Each of the edge recesses 212R has a width WR and a depth DR. In some instances, the width WR may be between about 15 nm and about 30 nm and the depth DR may be between about 5 nm and about 55 nm.

Embodiments of the present disclosure provide advantages. For example, methods of the present disclosure remove or trim wider outer fins such that the fins of a transistor have uniform sizes and profiles. The fin removal or trimming takes places after the fins are formed.

In one exemplary aspect, the present disclosure is directed to a method. The method includes forming a plurality of semiconductor fins over a substrate, the plurality of semiconductor fins having more than 3 semiconductor fins, after the forming of the plurality of semiconductor fins, removing an outer semiconductor fin of the plurality of semiconductor fins, and forming a gate structure over the plurality of semiconductor fins. The removing recesses a portion of the substrate directly under the outer semiconductor fin.

In some embodiments, the outer semiconductor fin is not disposed between two of the plurality of semiconductor fins. In some embodiments, a width of the outer semiconductor fin is greater than a width of any of the rest of the plurality of semiconductor fins. In some implementations, the forming of the plurality of semiconductor fins includes depositing a pad oxide layer over the substrate, depositing a pad nitride layer over the pad oxide layer, depositing an oxide layer over the pad nitride layer, forming a first patterned hard mask over the oxide layer, etching the pad oxide layer, the pad nitride layer, and the oxide layer using the first patterned hard mask as an etch mask to form a second patterned hard mask out of the oxide layer, the pad nitride layer and the pad oxide layer, and etching the substrate using the second patterned hard mask as an etch mask. In some instances, the removing of the outer semiconductor fin includes depositing a bottom layer over the plurality of semiconductor fins, depositing a middle layer over the bottom layer, and depositing a photoresist layer over the middle layer. In some embodiments, the removing of the outer semiconductor fin further includes curing the photoresist layer, etching the photoresist layer directly over the outer semiconductor fin, etching the middle layer directly over the outer semiconductor fin using difluoromethane, etching the bottom layer directly over the outer semiconductor fin using oxygen and sulfur dioxide, and etching the outer semiconductor fin using a fluorine-containing gas. In some embodiments, the method further includes after the removing of the outer semiconductor fin, forming a fin cut trench across the plurality of semiconductor fins to divide each of the plurality of semiconductor fins into a first portion and a second portion. In some instances, the plurality of semiconductor fins extend lengthwise along a first direction and the fin cut trench extends along a second direction perpendicular to the first direction.

In another exemplary aspect, the present disclosure is directed to a method. The method includes forming a first plurality of semiconductor fins and a second plurality of semiconductor fins over a substrate, each of the first plurality of semiconductor fins and the second plurality of semiconductor fins including more than 3 semiconductor fins, after the forming of the first plurality of semiconductor fins and the second plurality of semiconductor fins, removing a first outer semiconductor fin of the first plurality of semiconductor fins and a second outer semiconductor fin of the second plurality of semiconductor fins, and forming a first gate structure over the first plurality of semiconductor fins and a second gate structure over the second plurality of semiconductor fins. The removing forms a first recess directly under the first outer semiconductor fin and a second recess directly under the second outer semiconductor fin.

In some embodiments, the first plurality of semiconductor fins and the second plurality of semiconductor fins are spaced apart by an opening. In some embodiments, the method may further include before the forming of the first gate structure and the second gate structure, forming an isolation feature among the first plurality of semiconductor fins, the second plurality of semiconductor fins, over the first recess, over the second recess, and over the opening. In some implementations, the method may further include forming a dielectric fin over the isolation feature in the opening. In some instances, after the forming of the first gate structure and the second gate structure, the first gate structure and the second gate structure are separated by the dielectric fin. In some instances, after the removing of the first outer semiconductor fin and the second outer semiconductor fin, each of the first plurality of semiconductor fins and the second plurality of semiconductor fins includes a bottom width and a top width. The bottom width is between about 10 nm and about 20 nm and the top width is between about 8 nm and about 19 nm. In some embodiments, a sidewall of each of the first plurality of semiconductor fins and the second plurality of semiconductor fins forms a profile angle with a horizontal surface and wherein the profile angle is between about 83° and about 90°. In some embodiments, each of the first recess and the second recess includes a width between about 0 nm and about 30 nm and a depth between about 0 nm and about 50 nm.

In yet another exemplary aspect, the present disclosure is directed to a method. The method includes providing a workpiece including a semiconductor layer over a substrate, a composition of the semiconductor layer being different from a composition of the substrate, forming a plurality of semiconductor fins from the semiconductor layer and the substrate, the plurality of semiconductor fins including more than 3 semiconductor fins, after the forming of the plurality of semiconductor fins, removing an outer semiconductor fin of the plurality of semiconductor fins, after the removing of the outer semiconductor fin, forming a semiconductor liner over the plurality of semiconductor fins, and forming a gate structure over the plurality of semiconductor fins. The removing forms a recess directly under the outer semiconductor fin.

In some embodiments, the substrate includes silicon, the semiconductor layer includes germanium or silicon germanium, and the semiconductor liner includes silicon. In some embodiments, the method may further include before the forming of the semiconductor liner, forming a fin cut trench across the plurality of semiconductor fins to divide each of the plurality of semiconductor fins into a first portion and a second portion. In some embodiments, the removing the outer semiconductor fin includes use of sulfur hexafluoride, difluoromethane, fluoromethane, and oxygen.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a plurality of semiconductor fins over a substrate, the plurality of semiconductor fins comprising more than 3 semiconductor fins;
   after the forming of the plurality of semiconductor fins, removing an outer semiconductor fin of the plurality of semiconductor fins;
   after the removing of the outer semiconductor fin of the plurality of semiconductor fins, epitaxially depositing a semiconductor liner directly on surfaces of the plurality of semiconductor fins;
   forming an isolation feature over the semiconductor liner and among the plurality of semiconductor fins; and
   forming a gate structure over the plurality of semiconductor fins and over a top surface of the isolation feature,
   wherein the removing recesses a portion of the substrate directly under the outer semiconductor fin,
   wherein a width of the outer semiconductor fin is greater than a width of any of the rest of the plurality of semiconductor fins.

2. The method of claim 1, where the outer semiconductor fin is not disposed between two of the plurality of semiconductor fins.

3. The method of claim 1, wherein the forming of the plurality of semiconductor fins comprises:
   depositing a pad oxide layer over the substrate;
   depositing a pad nitride layer over the pad oxide layer;
   depositing an oxide layer over the pad nitride layer;
   forming a first patterned hard mask over the oxide layer;
   etching the pad oxide layer, the pad nitride layer, and the oxide layer using the first patterned hard mask as an etch mask to form a second patterned hard mask out of the oxide layer, the pad nitride layer and the pad oxide layer; and
   etching the substrate using the second patterned hard mask as an etch mask.

4. The method of claim 1, wherein the removing of the outer semiconductor fin comprises:
   depositing a bottom layer over the plurality of semiconductor fins;
   depositing a middle layer over the bottom layer; and
   depositing a photoresist layer over the middle layer.

5. The method of claim 4, wherein the removing of the outer semiconductor fin further comprises:
   curing the photoresist layer;
   etching the photoresist layer directly over the outer semiconductor fin;
   etching the middle layer directly over the outer semiconductor fin using difluoromethane;
   etching the bottom layer directly over the outer semiconductor fin using oxygen and sulfur dioxide; and
   etching the outer semiconductor fin using a fluorine-containing gas.

6. The method of claim 1, further comprising:
   after the removing of the outer semiconductor fin, forming a fin cut trench across the plurality of semiconductor fins to divide each of the plurality of semiconductor fins into a first portion and a second portion,
   wherein the forming of the isolation feature comprises forming the isolation feature over the fin cut trench.

7. The method of claim 6,
wherein the plurality of semiconductor fins extend lengthwise along a first direction,
wherein the fin cut trench extends along a second direction perpendicular to the first direction.

8. The method of claim 1,
wherein the substrate comprises silicon, and
wherein the semiconductor liner comprises silicon.

9. A method, comprising:
forming a first plurality of semiconductor fins and a second plurality of semiconductor fins over a substrate, each of the first plurality of semiconductor fins and the second plurality of semiconductor fins comprising more than 3 semiconductor fins;
after the forming of the first plurality of semiconductor fins and the second plurality of semiconductor fins, forming a mask layer over and interfacing the first plurality of semiconductor fins, the second plurality of semiconductor fins, and a top surface of the substrate;
patterning the mask layer to form a patterned mask layer;
removing a first outer semiconductor fin of the first plurality of semiconductor fins and a second outer semiconductor fin of the second plurality of semiconductor fins while a rest of the first plurality of semiconductor fins and a rest of the second plurality of semiconductor fins remain covered by the patterned mask layer;
after the removing the first outer semiconductor fin and the second outer semiconductor fin, selectively removing the patterned mask layer;
after the selectively removing, forming an isolation feature among the first plurality of semiconductor fins, the second plurality of semiconductor fins; and
forming a first gate structure over the first plurality of semiconductor fins and a second gate structure over the second plurality of semiconductor fins,
wherein the removing forms a first recess directly under the first outer semiconductor fin and a second recess directly under the second outer semiconductor fin,
wherein the first gate structure and the second gate structure are formed over a top surface of the isolation feature.

10. The method of claim 9, where the first plurality of semiconductor fins and the second plurality of semiconductor fins are spaced apart by an opening.

11. The method of claim 10, wherein the forming of the isolation feature comprises forming the isolation feature over the first recess, over the second recess, and over the opening.

12. The method of claim 11, further comprising:
forming a dielectric fin over the isolation feature in the opening.

13. The method of claim 12, wherein, after the forming of the first gate structure and the second gate structure, the first gate structure and the second gate structure are separated by the dielectric fin.

14. The method of claim 9,
wherein, after the removing of the first outer semiconductor fin and the second outer semiconductor fin, each of the first plurality of semiconductor fins and the second plurality of semiconductor fins comprises a bottom width and a top width,
wherein the bottom width is between about 10 nm and about 20 nm,
wherein the top width is between about 8 nm and about 19 nm.

15. The method of claim 9,
where a sidewall of each of the first plurality of semiconductor fins and the second plurality of semiconductor fins forms a profile angle with a horizontal surface,
wherein the profile angle is between about 83° and about 90°.

16. The method of claim 9, wherein each of the first recess and the second recess comprises a width between about 0 nm and about 30 nm and a depth between about 0 nm and about 50.

17. A method, comprising:
providing a workpiece comprising a semiconductor layer over a substrate, a composition of the semiconductor layer being different from a composition of the substrate;
forming a plurality of semiconductor fins from the semiconductor layer and the substrate, the plurality of semiconductor fins comprising more than 3 semiconductor fins;
after the forming of the plurality of semiconductor fins, removing an outer semiconductor fin of the plurality of semiconductor fins;
after the removing of the outer semiconductor fin, epitaxially depositing a semiconductor liner directly on surfaces of the plurality of semiconductor fins; and
forming a gate structure over the plurality of semiconductor fins,
wherein the removing forms a recess directly under the outer semiconductor fin.

18. The method of claim 17,
wherein the substrate comprises silicon,
wherein the semiconductor layer comprises germanium or silicon germanium,
wherein the semiconductor liner comprises silicon.

19. The method of claim 17, further comprising:
before the forming of the semiconductor liner, forming a fin cut trench across the plurality of semiconductor fins to divide each of the plurality of semiconductor fins into a first portion and a second portion.

20. The method of claim 17, wherein the removing the outer semiconductor fin comprises use of sulfur hexafluoride, difluoromethane, fluoromethane, and oxygen.

* * * * *